United States Patent
Negishi et al.

(10) Patent No.: US 6,691,400 B1
(45) Date of Patent: *Feb. 17, 2004

(54) HIGH SPEED ELECTRONIC PARTS MOUNTING APPARATUS HAVING MOUNTING HEADS WHICH ALTERNATELY MOUNT COMPONENTS ON A PRINTED CIRCUIT BOARD

(75) Inventors: Shigetoshi Negishi, Osaka (JP); Takeshi Nishiguchi, Kyoto (JP); Mikio Yasuda, Ichinomiya (JP); Takashi Munezane, Osaka (JP); Manabu Morioka, Nara (JP); Takayoshi Kado, Osaka (JP); Takaharu Fuji, Osaka (JP); Noboru Furuta, Osaka (JP)

(73) Assignee: Matsushita Electric Industrial Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/761,226

(22) Filed: Dec. 6, 1996

(30) Foreign Application Priority Data

Dec. 15, 1995 (JP) ............................... 7-326773
May 13, 1996 (JP) ............................... 8-117633

(51) Int. Cl.[7] ................................................ H05K 3/30
(52) U.S. Cl. ............................... 29/740; 29/741; 29/712; 29/742; 29/743; 29/759; 29/DIG. 44; 29/832; 29/834; 29/836
(58) Field of Search .......................... 29/712, 740, 741, 29/742, 743, 759, DIG. 44, 832, 834, 836

(56) References Cited

U.S. PATENT DOCUMENTS

| | | | |
|---|---|---|---|
| 3,662,881 A | | 5/1972 | Fineran |
| 4,951,383 A | * | 8/1990 | Amao et al. ............... 29/743 X |
| 4,984,354 A | | 1/1991 | Mohara et al. |
| 5,093,984 A | * | 3/1992 | Lape ............................ 29/741 |
| 5,203,061 A | | 4/1993 | Hamada |
| 5,218,753 A | * | 6/1993 | Suzuki et al. .................. 29/740 |
| 5,299,902 A | * | 4/1994 | Fujiwara et al. .......... 29/740 X |
| 5,323,528 A | * | 6/1994 | Baker ........................ 29/740 X |
| 5,329,692 A | * | 7/1994 | Kashiwagi ................ 29/743 X |

FOREIGN PATENT DOCUMENTS

| | | |
|---|---|---|
| GB | 2205055 | 11/1988 |
| JP | 2-17899 | 2/1990 |
| JP | 4-796 | 1/1992 |
| JP | 06-085492 | 3/1994 |
| JP | 6085492 | 3/1994 |
| JP | 7202491 | 8/1995 |
| JP | 07-202491 | 8/1995 |
| JP | 7-202496 | 8/1995 |

* cited by examiner

*Primary Examiner*—Richard Chang
(74) *Attorney, Agent, or Firm*—Connolly Bove Lodge & Hutz LLP

(57) ABSTRACT

A compact and high-speed automatic electronic parts mounting apparatus is provided which includes first and second parts feeders, first and second mounting heads, a printed board-holding table, and a controller. Each of the first and second parts feeders includes a plurality of cassettes storing therein electronic parts and having pick-up stations. The second parts feeder is arranged at a preselected interval away from the first parts feeder in a first direction. Each of the first and second mounting heads is movable in the first direction and includes a plurality of pick-up nozzles movable in a vertical direction for picking up the electronic parts from the pick-up stations of the cassettes. The printed board-holding table is disposed within the preselected interval between the first and second parts feeders so as to move in a second direction perpendicular to the first direction. The controller controls the movement of the table and the first and second mounting heads so that the first and second mounting heads pick up the electronic parts from the cassettes of the first and second parts feeders, respectively, and mount them on a printed board held on the table in sequential mounting operations.

18 Claims, 28 Drawing Sheets

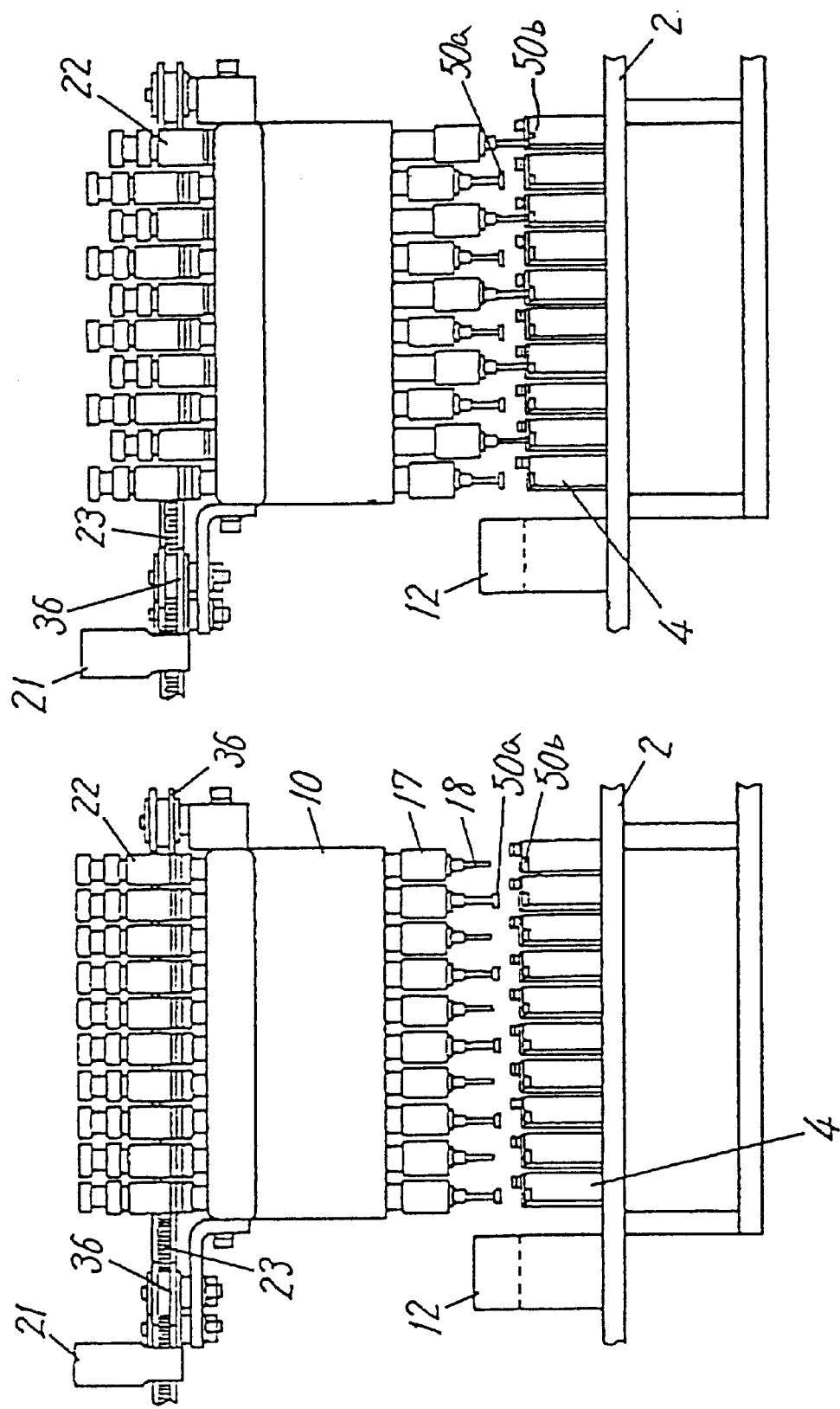

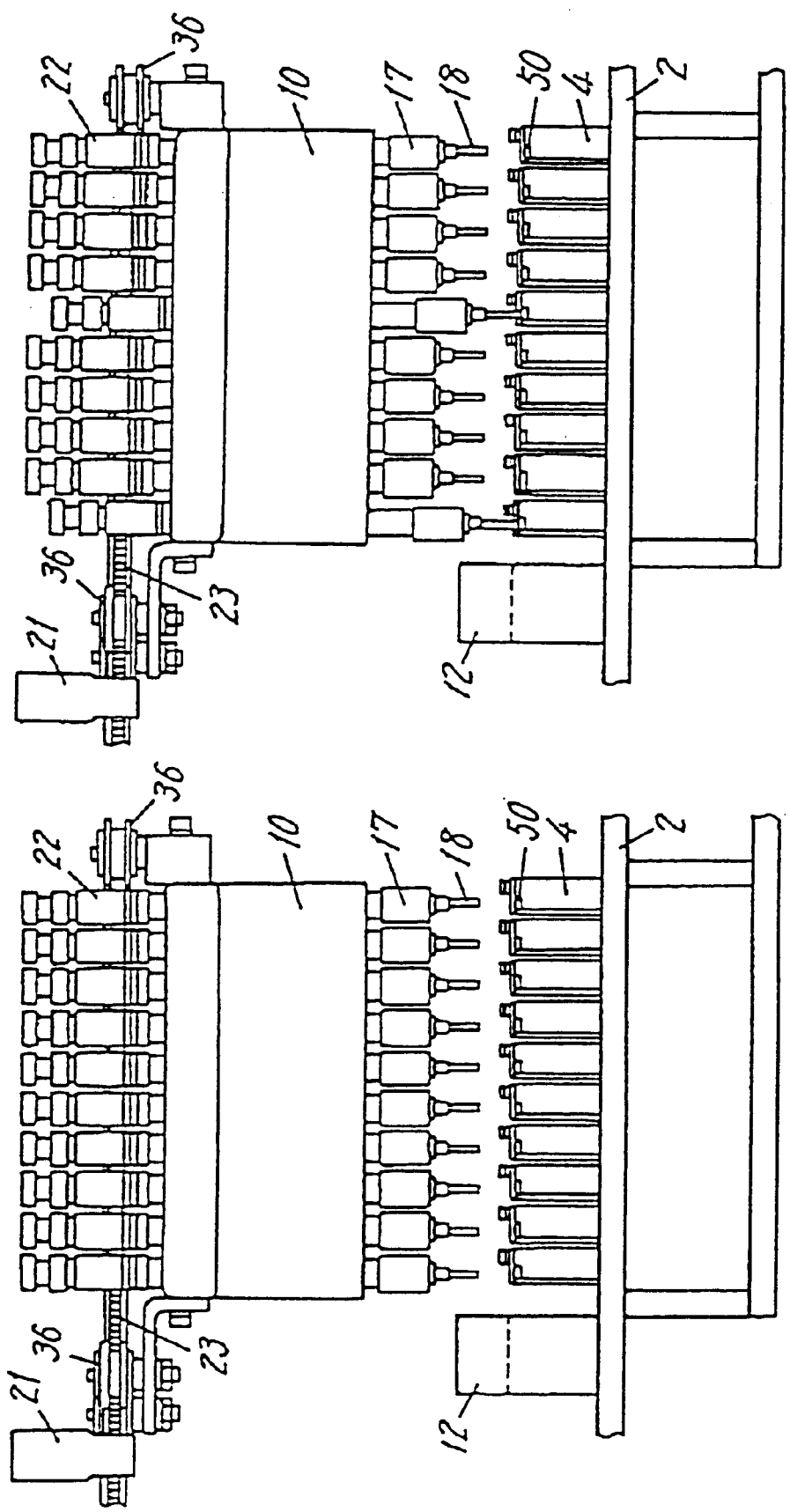

HIGH SPEED ELECTRONIC PARTS MOUNTING APPARATUS HAVING MOUNTING HEADS WHICH ALTERNATELY MOUNT COMPONENTS ON A PRINTED CIRCUIT BOARD

BACKGROUND OF THE INVENTION

1. Technical Field

The present invention relates generally to an automatic electronic parts mounting apparatus, and more particularly to a compact and high-speed electronic parts mounting apparatus designed to mount chip components on a printed circuit board.

2. Background of Related Art

Japanese Patent First Publication No. 6-85492 teaches a robot-operated mounting apparatus, as shown in FIG. 26, which is in widespread use. This mounting apparatus includes an electronic parts feeder 70, a board holder 79 for holding a printed board 75, a mounting head 72, a first drive shaft 73, and a second drive shaft 74. The electronic parts feeder 70 has disposed thereon cassettes 77 for supplying taped electronic parts in sequence. The mounting head 72 supports a pick-up nozzle 71 rotatably and slidably for picking up the electronic parts and mounting them on the printed board 75. The first drive shaft 73 has disposed thereon the mounting head 72. The second drive shaft 74 moves the first drive shaft 73 in a direction perpendicular to the first drive shaft 73 for allowing the mounting head 72 to be displaced in X-and Y-coordinate directions.

Japanese Patent First Publication No. 7-202491 teaches a high-speed rotary mounting apparatus, as shown in FIG. 27, which includes a rotary head 81, a parts feeder 80, an electronic parts monitor 86, and an XY table 83. The rotary head 81 has pick-up nozzles 82 disposed on a circumferential portion thereof which are rotated intermittently. The parts feeder 80 is moved to a location where one of the pick-up nozzles 82 is stopped. The XY table 83 holds a printed board on which electronic parts are to be mounted and moves in two directions perpendicular to each other. The picking up, monitoring, and mounting the electronic parts are achieved in synchronization with rotation of the rotary head 81.

The above prior art mounting apparatuses, however, have the following drawbacks. The robot-operated mounting apparatus is simple and compact in structure, but it is difficult to perform a high-speed operation because the electronic parts are picked up and mounted, one by one, on the printed board 75. The high-speed rotary mounting apparatus can install the electronic parts on the printed board at high speeds, but its structure is bulky, and the cost of equipment is high. A compact and high-speed mounting machine combining the advantages of the above two conventional apparatuses is thus sought.

SUMMARY OF THE INVENTION

It is therefore a principal object of the present invention to avoid the disadvantages of the prior art.

It is another object of the present invention to provide a compact and high-speed electronic parts mounting apparatus.

According to one aspect of the present invention, there is provided an electronic parts mounting apparatus which comprises: (a) a first parts feeder including a plurality of cassettes each of which stores therein electronic parts and has a pick-up station; (b) a second parts feeder including a plurality of cassettes each of which stores therein electronic parts and has a pick-up station, the second parts feeder being arranged at a preselected interval away from the first parts feeder in a first direction; (c) a table for holding thereon a printed board on which the electronic parts are to be mounted, the table being disposed within the preselected interval between the first and second parts feeders and designed to move in a second direction perpendicular to the first direction; (d) a first mounting head including a plurality of pick-up nozzles movable in a vertical direction for picking up the electronic parts from the pick-up stations, the first mounting head being disposed so as to move in the first direction; (e) a second mounting head including a plurality of pick-up nozzles movable in the vertical direction for picking up the electronic parts from the pick-up stations, the second mounting head being disposed so as to move in the first direction; and (f) a controller for controlling movement of the table and the first and second mounting heads so that the first and second mounting heads pick up the electronic parts from the pick-up stations and then mount the electronic parts on given places of the printed board held on the table.

In the preferred mode of the invention, the cassettes of each of the first and second parts feeders are disposed adjacent to each other at first pitches in the first direction. The pick-up nozzles of each of the first and second mounting heads are disposed adjacent to each other at second pitches equal to the first pitches.

The controller controls the movement of the first and second mounting heads in first and second operation modes. The first operation mode is such that the first mounting head picks up the electronic parts from the pick-up stations of the first parts feeder through the pick-up nozzles, while the second mounting head mounts the electronic parts which have already been picked up by the pick-up nozzles thereof on the printed board held on the table. The second operation mode is such that the second mounting head picks up the electronic parts from the pick-up stations of the second parts feeder through the pick-up nozzles, while the first mounting head mounts the electronic parts which have already been picked up by the pick-up nozzles thereof on the printed board held on the table.

The controller controls vertical movement of the pick-up nozzles of each of the first and second mounting heads so that the pick-up nozzles of each of the first and second mounting heads pick up the electronic parts simultaneously.

The controller may alternatively control the first and second mounting heads so that a first group consisting of a first number of the pick-up nozzles and a second group consisting of a second number of the pick-up nozzles of each of the first and second mounting heads are moved with different timings for picking up the electronic parts.

Each of the pick-up nozzles of the first group of each of the first and second mounting heads picks up one of the electronic parts from selected one of the pick-up stations of the cassettes in a first pick-up operation, while each of the pick-up nozzles of the second group of each of the first and second mounting heads picks up one of the electronic parts from selected one of the pick-up stations of the cassettes in a second pick-up operation following the first pick-up operation.

The controller may control the vertical movement of the pick-up nozzles of each of the first and second mounting heads so that at least one of the pick-up nozzles of each of the first and second mounting heads is moved to pick up one of the electronic parts from selected one of the pick-up stations of the cassettes.

The controller may control the movement of each of the first and second mounting heads in the first direction and the vertical movement of the pick-up nozzles of each of the first and second mounting heads so that each of a given number of the pick-up nozzles of each of the first and second mounting heads picks up one of the electronic parts from selected one of the pick-up stations of the cassettes.

Each of the first and second mounting heads includes a nozzle-moving mechanism having an elevation member for elevating the pick-up nozzles upward simultaneously and dropping means for dropping the pick-up nozzles independently of each other.

A first and a second sensor are disposed in the first and second parts feeders, respectively, for monitoring the presence and orientation of the electronic parts picked up by the pick-up nozzles and providing signals indicative thereof.

A turning means is further provided which turns each of the pick-up nozzles about the center thereof.

Each of the pick-up nozzles has a length extending in the vertical direction. The turning means turns each of the pick-up nozzles about a center line thereof extending in a lengthwise direction of each of the pick-up nozzles.

A position monitor and a positional shift correcting mechanism are further provided. The position monitor monitors the position of each of the electronic parts held by the pick-up nozzles to determine a positional shift from a given correct position. The positional shift correcting mechanism adjusts a relative position between the table and one of the electronic parts having the positional shift so as to compensate for the positional shift.

The positional shift correcting mechanism includes the turning means and a moving mechanism designed to move the table in the second direction.

The positional shift correcting mechanism also includes a second moving mechanism designed to move the first and second mounting heads in the first direction.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings:

FIGS. 14(a), 14(b), 15(a), 15(b), and 16 are front views which show a sequence of operations of mounting heads when picking up electronic parts according to the second embodiment of the invention;

FIGS. 17(a), 17(b), 18(a), 18(b), 19(a), and 19(b) are front views which show a sequence of operations of mounting heads when picking up electronic parts according to the third embodiment of the invention;

DESCRIPTION OF THE PREFERRED EMBODIMENT

Figure 1:
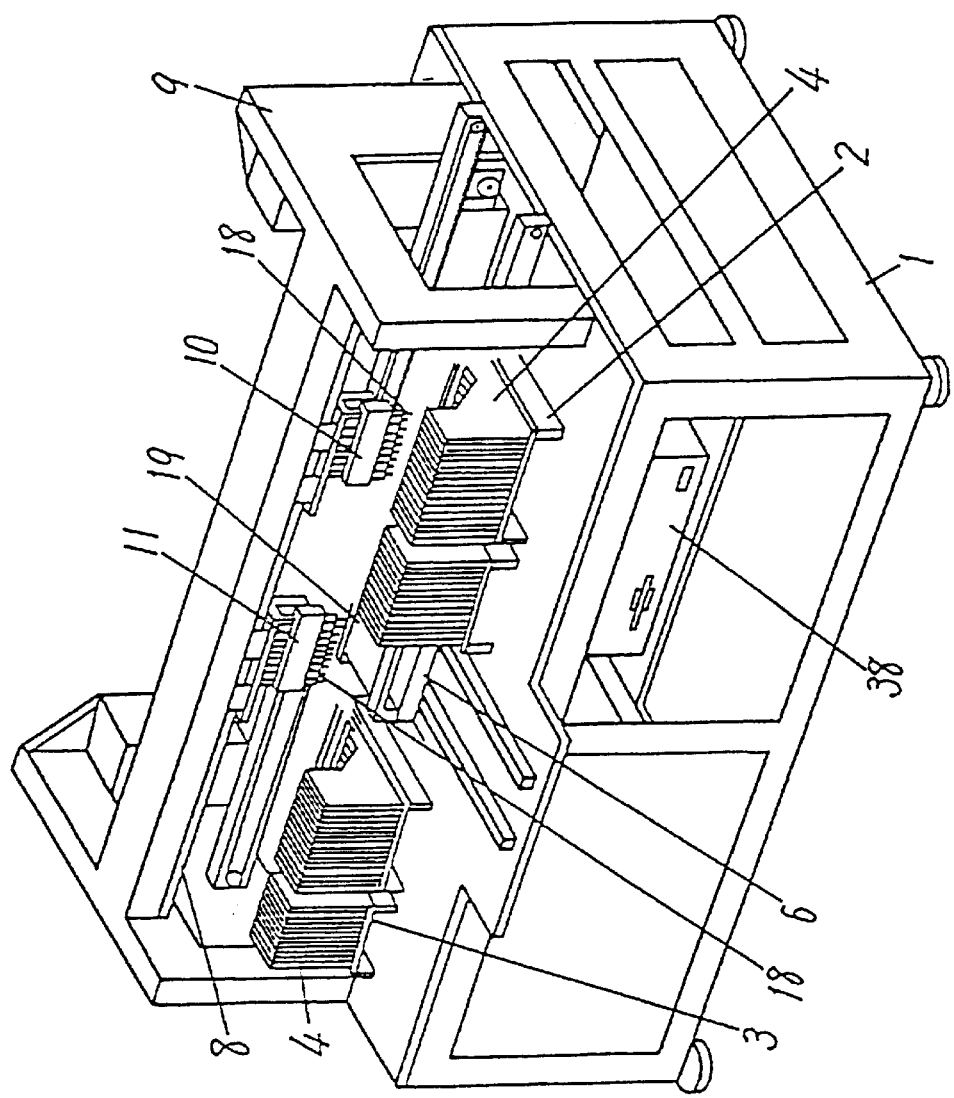
FIG. 1 is a perspective view which shows an electronic parts mounting apparatus according to the first embodiment of the invention.

Referring now to the drawings, particularly to FIG. 1, there is shown an electronic parts mounting apparatus according to the first embodiment of the invention.

The electronic parts mounting apparatus includes generally a base frame 1, first and second parts feeders 2 and 3, a table 6, first and second mounting heads 10 and 11, and a controller 38 controlling all operations of the apparatus.

Each of the first and second parts feeders 2 and 3 has disposed thereon two sets of cassettes 4 each storing therein electronic parts. The first and second parts feeders 2 and 3 are installed on the base frame 1 at a given interval. The table 6 is disposed within the interval between the first and second parts feeders 2 and 3 and is designed to be moved, as shown in FIG. 2, by an electric motor 14 through a ball screw 5 along guide rails 7 in the same direction (i.e., Y-direction) as that of supply of the electronic parts from the cassettes 4 while holding a printed board 19.

Each of the first and second mounting heads 10 and 11 retains a plurality of pick-up nozzles (vacuum nozzles) 18 for drawing and holding the electronic parts and are moved by a guide rail assembly 8 having disposed therein a known drive mechanism, installed on an lower surface of an upper frame 9 connected to the base frame 1 in a direction (i.e., X-direction) perpendicular to the direction of supply of the electronic parts (i.e., Y-direction). The pick-up nozzles 18 are arranged adjacent to one another in the X-direction at given pitches identical with those at which the cassettes 4 are disposed on the first and second parts feeders 2 and 3 so that each of the pick-up nozzles 18 may be aligned with corresponding one of the cassettes 4 when picking up the electronic parts.

Figure 2:
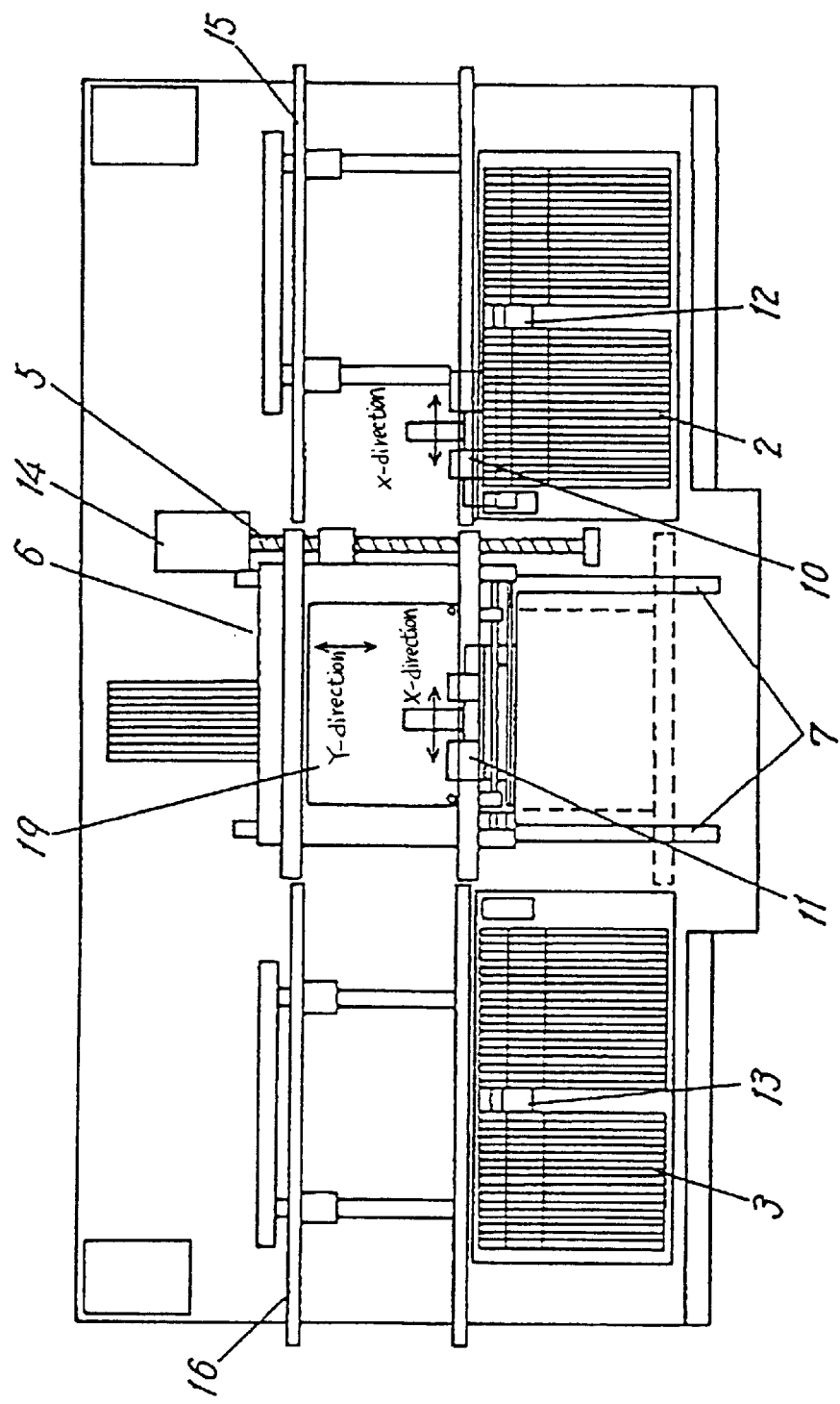
FIG. 2 is a plan view of FIG. 1.

The electronic parts mounting apparatus also includes, as shown in FIG. 2, a loader 15, an unloader 16, and first and second line sensors 12 and 13. The loader 15 transports the printed board 19 to the table 6. The unloader 16 transports the printed board 19 out of the table 6. Each of the first and second line sensors 12 and 13 is disposed between the two sets of the cassettes 4, that is, at the center of one of the first and second feeders 2 and 3 and measures heights of the electronic parts held by the pick-up nozzles 18. The first and second line sensors 12 and 13 have formed therein grooves for allowing the pick-up nozzles 18 holding the electronic parts to move therethrough in the X-direction.

Figure 3:
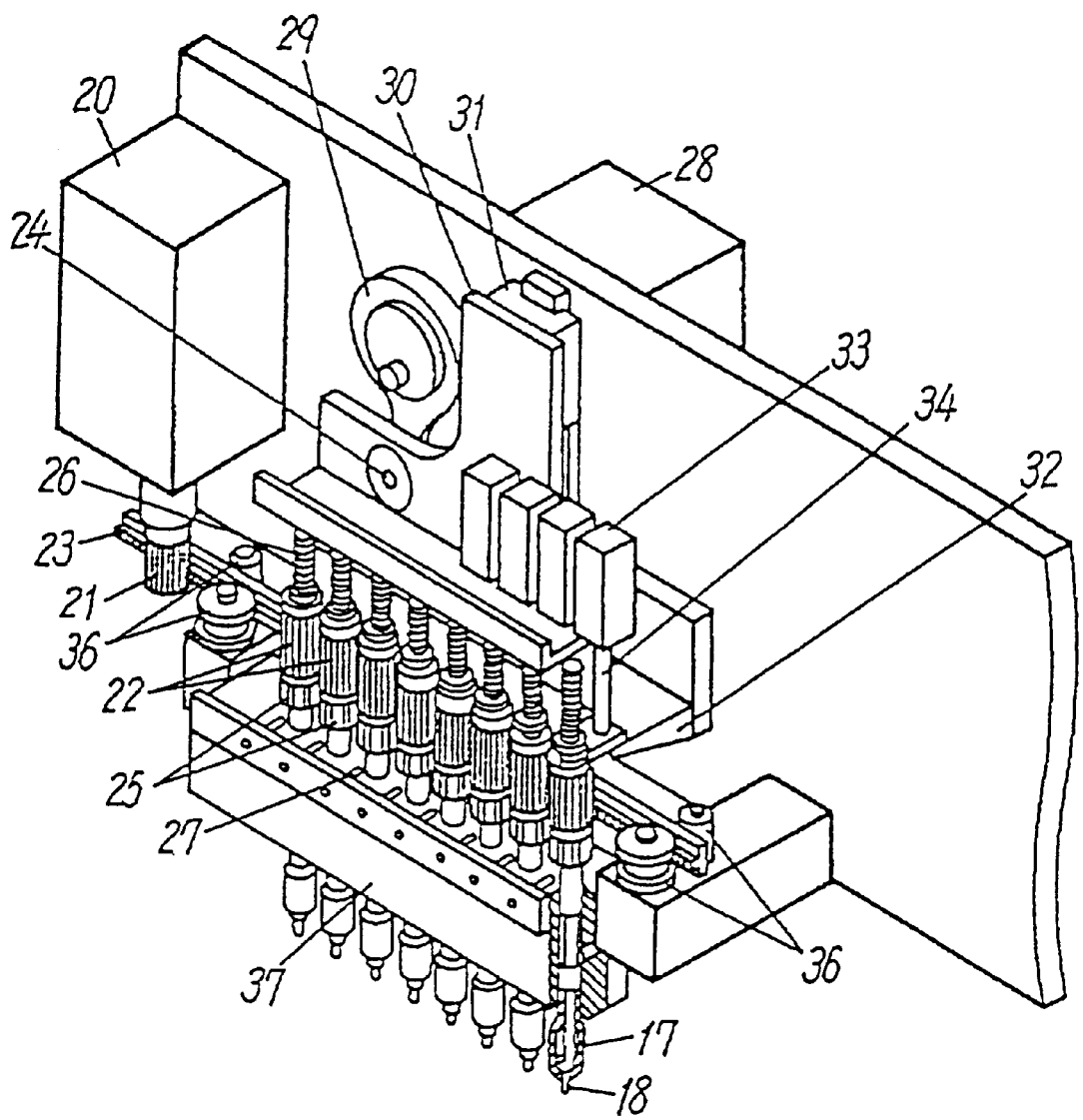
FIG. 3 is a partially perspective view which shows a mounting head.
Figure 4:
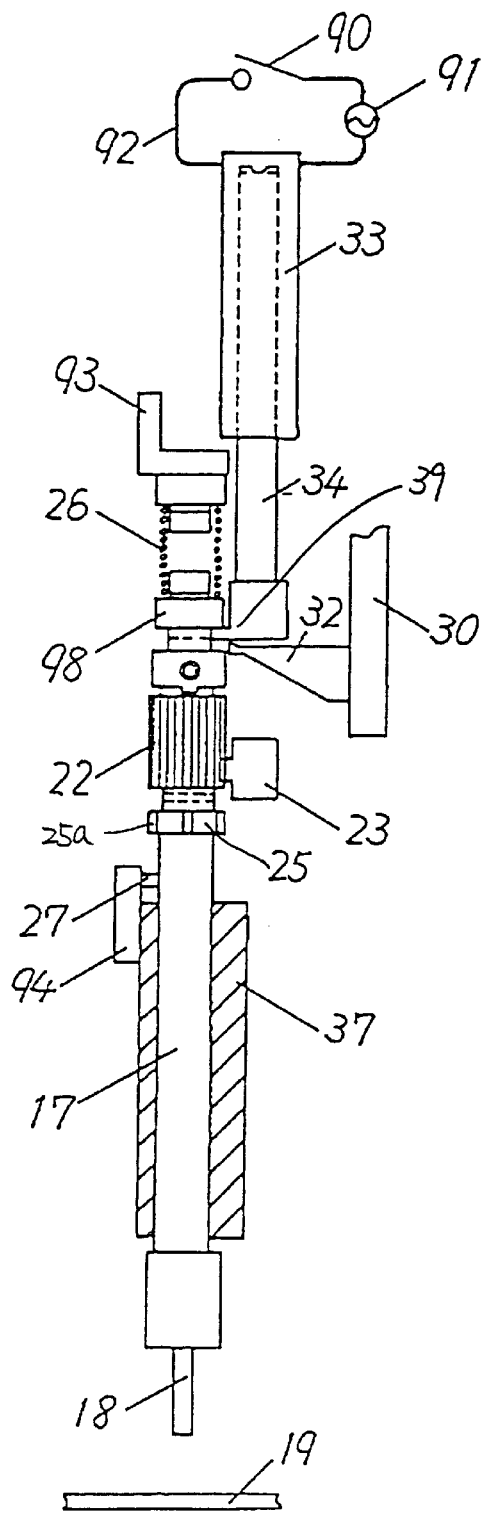
FIG. 4 is a side view which shows one of pick-up nozzles disposed on the mounting head shown in FIG. 3.

FIG. 3 shows the structure of each of the first and second mounting heads 10 and 11. The pick-up nozzles 18 are installed within shafts 17 which are supported by a bearing block 37 movably in a vertical direction and rotatably and have disposed on their upper ends positioning holders 25. Each of the positioning holders has, as clearly shown in FIG. 4, formed in its circumferential surface a plurality of vertical grooves 25a one of which engages corresponding one of positioning pins 27 secured on a plate 94 attached to the front surface of the bearing block 37 when the shaft 17 reaches a lower dead center.

On the bearing block 37, a rotation drive motor and a vertical slide drive motor 28 are mounted. The rotation drive motor 20 has mounted thereon a drive gear (i.e., a pinion) 21 meshing with a rack 23 slidably supported by guide rollers 36. The rack 23 meshes with a set of driven gears 22 installed on the shafts 17.

A crank 29 is installed eccentrically on the vertical slide drive motor 28 and supported rotatably by a pin 24 mounted on the crank 29, a plate 30 slidably mounted on a slider 31 in a vertical direction, and a bearing. The plate 30 has a first pawl 32 engaging second pawls 39, as clearly shown in FIG. 4, secured on bottoms of cylinders 34 slidably supported in electromagnets 33.

Each of the second pawls 39 of the cylinders 34 engages a flange 98 mounted rotatably on an upper end of corresponding one of the shafts 17. Disposed between each of the flanges 98 and a block 93 is a coil spring 26 urging the shaft 17 downward.

Each of the electromagnets 33 is connected to a power source 91 through a switch 90 and a wire 92.

Figure 5:
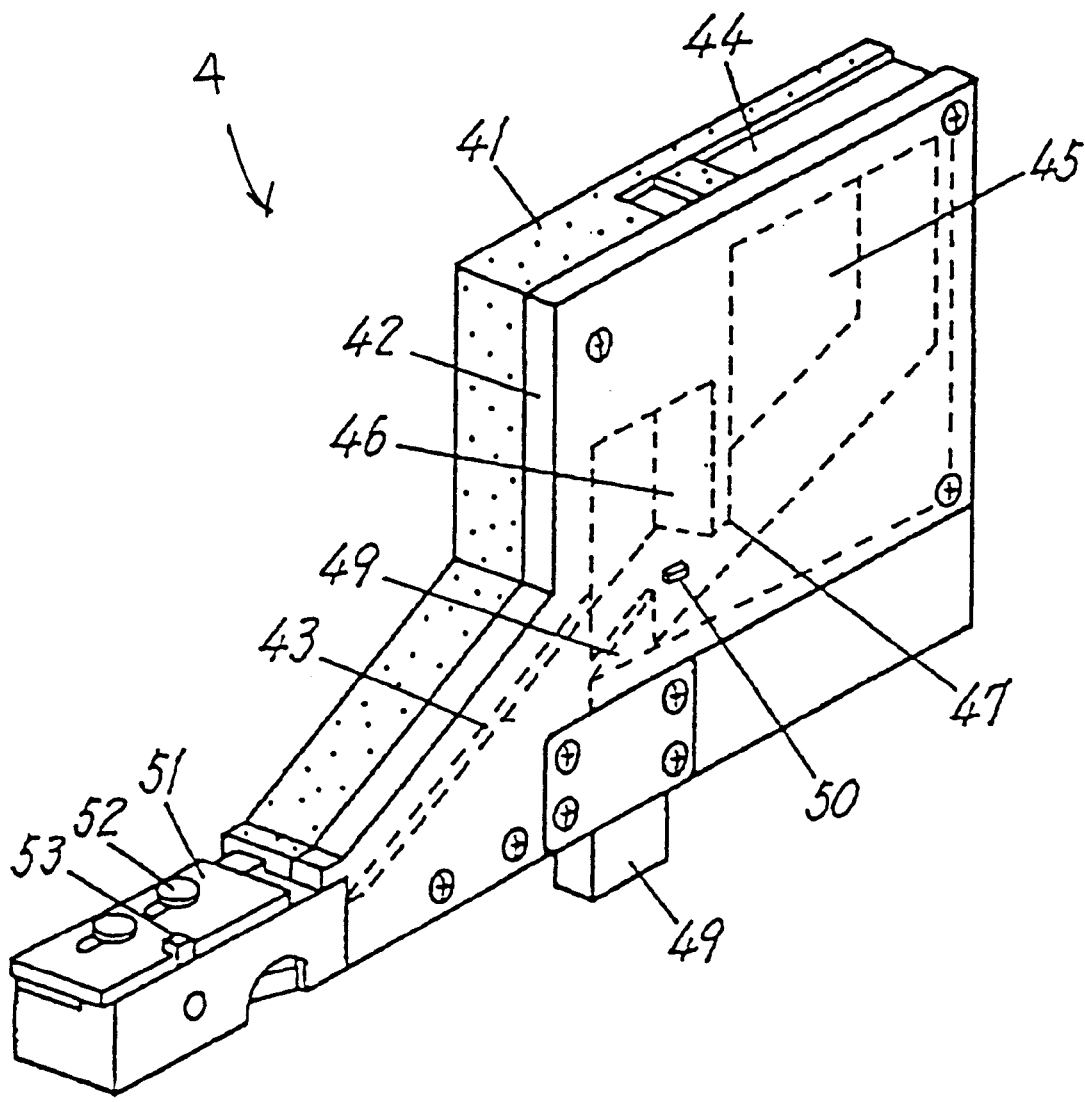
FIG. 5 is a perspective view which shows one of cassettes storing therein electronic parts.
Figure 6:
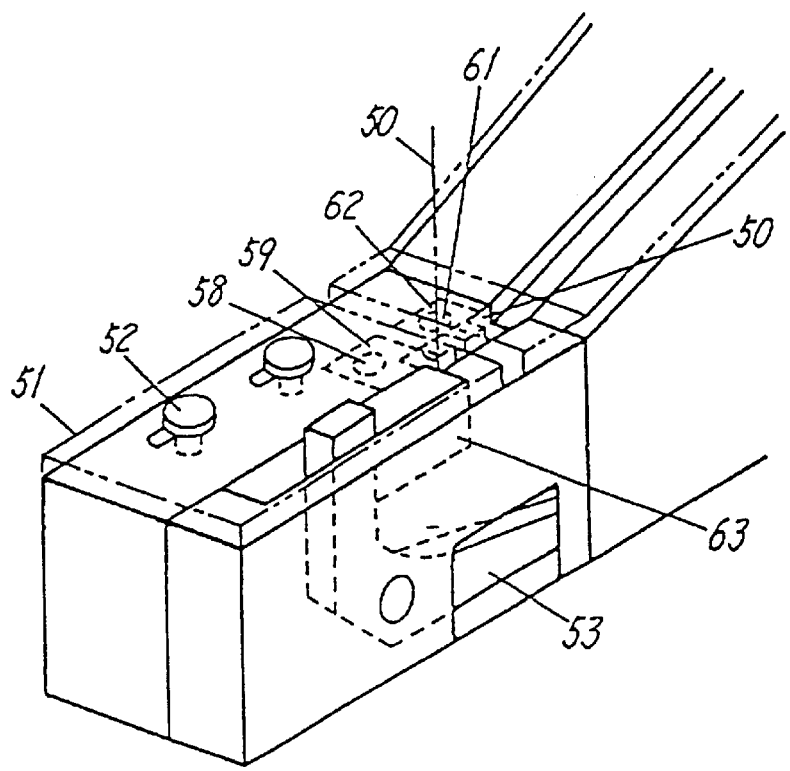
FIG. 6 is a partially perspective view which shows an electronic parts positioning mechanism of the cassette shown in FIG. 5.
Figure 7:
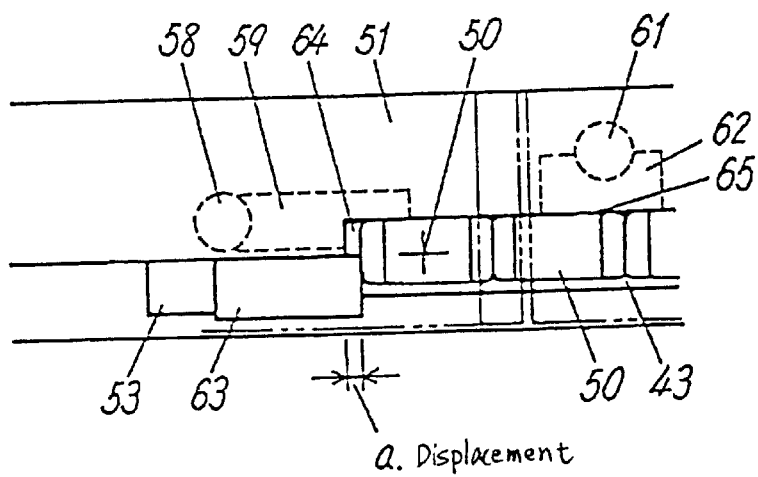
FIG. 7 is a plan view of FIG. 6.

FIGS. 5 to 7 show one of the cassettes 4 mounted on the first and second parts feeders 2 and 3 which has the same structure as taught in Japanese Patent First Publication No. 7-28159, disclosure of which is incorporated herein by reference.

The cassette 4 includes, as shown in FIG. 5, a casing 41, a lid 44 for loading electronic parts, and an acrylic plate 42. A partition plate 47 is disposed within the casing 41 to define first and second storage chambers 45 and 46 so that the electronic parts are transported gradually from the first storage chamber 45 into the second storage chamber 46.

An elevator block 49 is inserted into the second storage chamber 46 through the bottom of the casing 41. A shoot 53 is formed in the casing 41 for transporting the electronic parts 50 in alignment. The acrylic plate 42 which is protected against static electricity covers the front of the casing 41 so that the electronic parts 50 can be viewed therethrough. A shutter 51, a guide pin 52, and a lever 53 are provided at an outlet (i.e., a pick-up station) of the shoot 43. The shutter 51 is moved to be opened and closed by the lever 53 through the guide pin 52 only when the electronic parts 50 are supplied.

The lever 53 is, as can be seen from FIGS. 6 and 7, provided near the outlet of the shoot 43 to open and close the shutter 51 for exposing a leading one of the electronic parts 50 and to control linear movement of the stopper 63. The shutter 51 has formed therein a first vacuum groove 59 connected to a vacuum source (not shown), a first vacuum hole 58, a second vacuum groove 62 connected to the vacuum source, and a second vacuum hole 61. The first vacuum groove 59 communicates between the first vacuum hole 58 and the outlet of the shoot 43 for positioning the electronic parts 50. The second vacuum groove 62 communicates between the second vacuum hole 61 and a side portion of the shoot 43 for separating a leading one of the electronic parts 50 from the following ones to facilitate sequential transportation of the electronic parts 50 to the outlet of the shoot 43.

The operations of the mounting heads 10 and 11 will be discussed below.

Figure 8A:
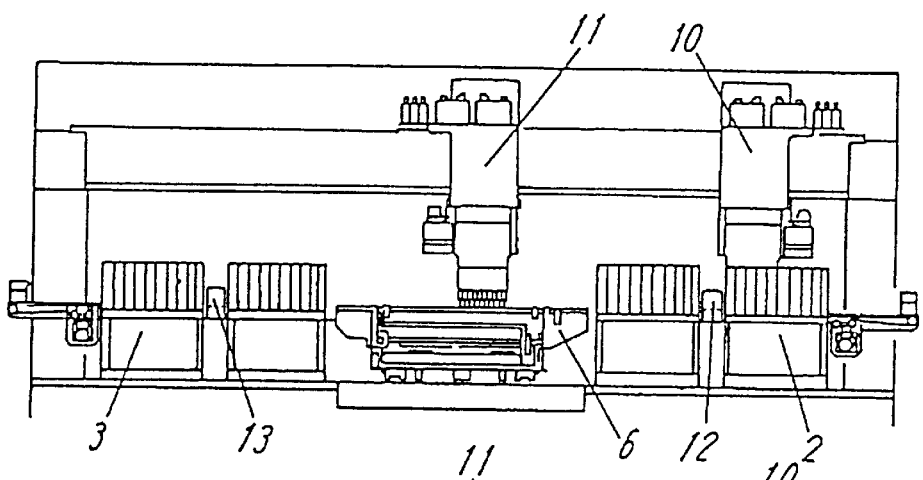
FIGS. 8(a) and 8(b) are plan views which show pick-up and mounting operations of an electronic parts mounting apparatus.

First, the first mounting head 10 is moved, as shown in FIG. 8(a), to a location on the first feeder 2 specified by a program of the controller 38 and picks up the electronic parts 50 through the pick-up nozzles 18.

Figure 8B:
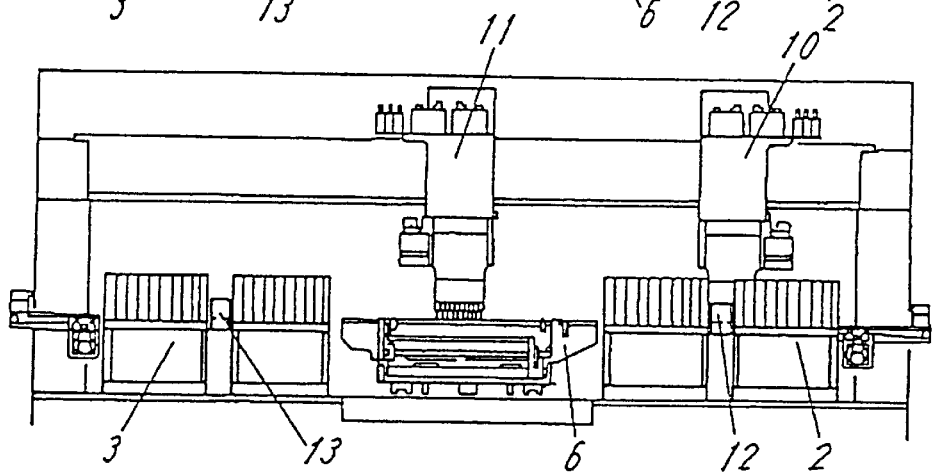

Subsequently, the first mounting head 10 travels, as shown in FIG. 8(b), to the first line sensor 12. The first line sensor 12 detects the presence, orientation, and height of each of the electronic parts 50 held by the pick-up nozzles 18 to provide a signal indicative thereof to the controller 38. At this time, the second mounting head 11 mounts the electronic parts 50 which have been already picked up from the second feeder 3 on the printed board 19 held on the table 6.

Figure 9A:
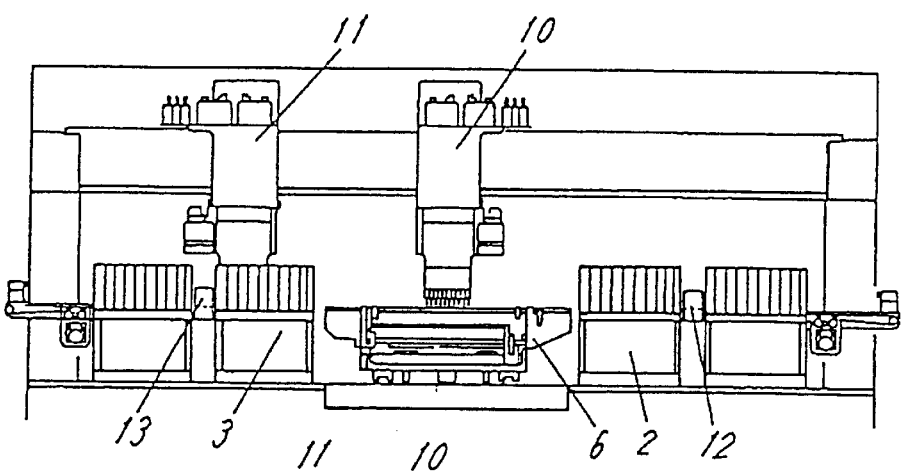
FIGS. 9(a) and 9(b) are plan views which show pick-up and mounting operations of an electronic parts mounting apparatus.
Figure 9B:
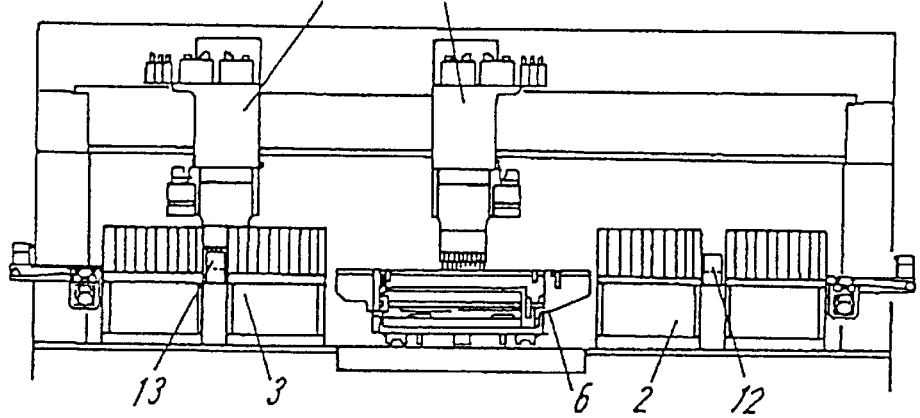

Upon completion of the mounting operation of the second mounting head 11, the first mounting head 10 is moved, as shown in FIG. 9(a), over the printed board 19 on table 6 and mounts the picked up electronic parts 50 on the printed board 19. The second mounting head 11 is moved to a location on the second feeder 3 specified by the controller 38 to pick up the electronic parts 50 and then, as shown in FIG. 9(b), to the second line sensor 13. The second line sensor 13 detects the presence, orientation, and height of each of the electronic parts 50 held by the pick-up nozzles 18 to provide a signal indicative thereof to the controller 38.

The above sequential operations are repeated several times to mount a required number of the electronic parts 50 on the printed board 19.

The positioning of the electronic parts 50 at the pick-up station of each of the cassettes 4 will be discussed below.

A sequence of the electronic parts 50 transported along the shoot 43 are stopped by the stopper 63 as shown in FIGS. 6 and 7. A negative pressure is applied to the second vacuum hole 61 and the second vacuum groove 62 to draw, as clearly shown in FIG. 7, the second and third electronic parts 50 and hold them on the positioning side wall 65 of the second vacuum groove 62. The lever 53 then swings to move the stopper 63 a distance a, as shown in FIG. 7, in the same direction as flow of the electronic parts 50 so that a leading one of the electronic parts 50 is set free. A negative pressure is then applied to the first vacuum hole 58 and the first vacuum groove 59 to draw the leading one of the electronic parts 50 so that it is positioned by the positioning end wall 64 and the positioning side wall 65.

The operation of picking up the thus positioned leading one of the electronic parts 50 will be discussed with reference to FIGS. 3, 4, 10(a), 10(b), and 11.

Figures 10A, 10B:
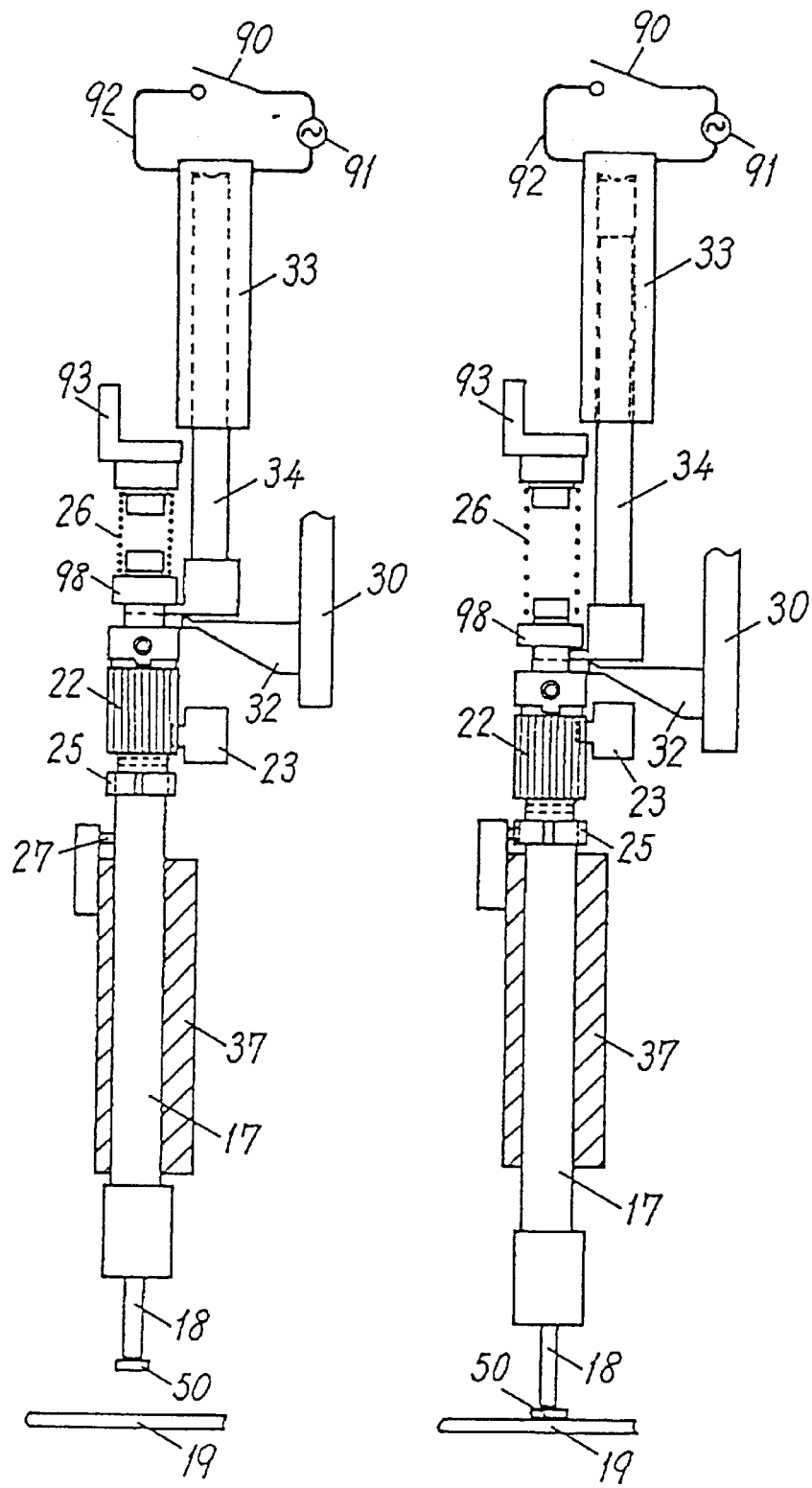
FIGS. 10(a) and 10(b) are side views which show a sequence of pick-up operations of a pick-up nozzle.

When the switch 90, as shown in FIG. 10(a), is in an off-position, the cylinder 34 is held on the pawl 32 without being attracted by the electromagnet 33. When the vertical slide drive motor 28 is turned on, it will cause the pin 24, as shown in FIG. 3, installed on the crank 29 to be moved downward, thereby moving the plate 30 and the pawl 32 downward along the slider 31. This causes the flanges 98 mounted on the upper ends of the shafts 17 to be moved downward with the aid of the spring force of the springs 26. The positioning pins 27 then engage the vertical grooves 25a of the positioning holders 25, respectively, to hold angular positions of the pick-up nozzles 18.

When it is required for the pick-up nozzles 18 to be moved downward into contact with the electronic parts 50 positioned at the pick-up stations of the cassettes 4, the vertical slide drive motor 28 is turned off. The pick-up nozzles 18 are then evacuated through solenoid valves (not shown) to draw the electronic parts 50. The vertical slide drive motor 28 is reversed to elevate the pick-up nozzles 18. Upon reaching an upper dead center, the pick-up nozzles are brought to a standstill.

Figure 11:
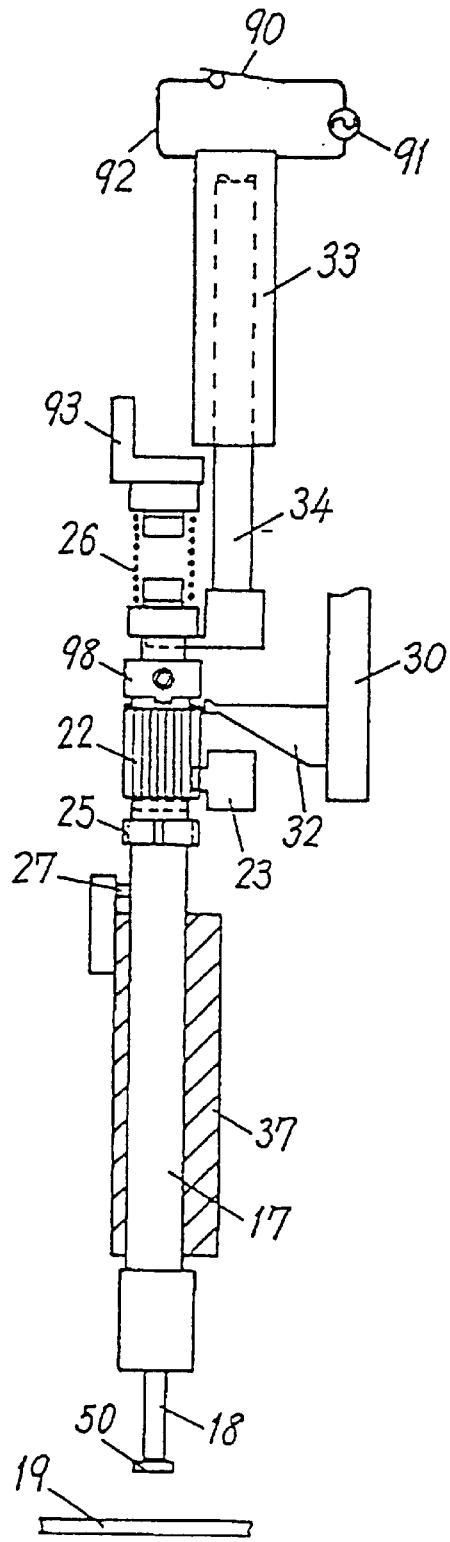
FIG. 11 is a side view which shows an operation of arresting a pick-up operation of a pick-up nozzle.

When the switch 90 is turned on as shown in FIG. 11, the electromagnets 33 are energized to attract the cylinders 34 upward. This prevents the cylinders 34, the flanges 98, the shafts 17, and the pick-up nozzles 18 from moving downward against downward movement of the pawl 32 by the vertical slide drive motor 28. Thus, the electronic parts 50 are not picked up by the pick-up nozzles 18.

The operation of mounting the electronic parts 50 picked up by the pick-up nozzles 18 will be discussed below.

First, the pin 24 installed on the crank 29 is moved downward by rotation of the vertical slide drive motor 28, thereby moving the plate 30 and the pawl 32 downward, as shown in FIG. 10(b), along the slider 31. This causes the flange 98 of each of the shafts 17 to be moved downward with aid of the spring force of the spring 26. The positioning pins 27 then engage the vertical grooves 25a of the positioning holders 25 to hold angular positions of the pick-up nozzles 18, respectively.

When the pick-up nozzles 18 are moved downward until the electronic parts 50 are brought into contact with the printed board 19, the vertical slide drive motor 28 is turned off. The pressure in the pick-up nozzles 18 is then switched to a positive level through the solenoid valves (not shown) to release the electronic parts 50 onto the printed board 19. The vertical slide drive motor 28 is reversed to elevate the pick-up nozzles 18. Upon reaching the upper dead center, the pick-up nozzles are brought to a standstill.

When the switch 90 is turned on as shown in FIG. 11, the electromagnets 33 are energized to attract the cylinders 34 upward. This prevents the cylinders 34, the flanges 98, the shafts 17, and the pick-up nozzles 18 from moving downward regardless of downward movement of the pawl 32 by the vertical slide drive motor 28. Thus, the electronic parts 50 are not mounted on the printed board 19.

The orientation of the electronic parts 50 when mounted on the printed board 19 is accomplished by turning on the rotation drive motor to rotate the driven gears 22 through the pinion 21 and the rack 23 to adjust angular positions of the pick-up nozzles 18.

Figures 12A, 12B:
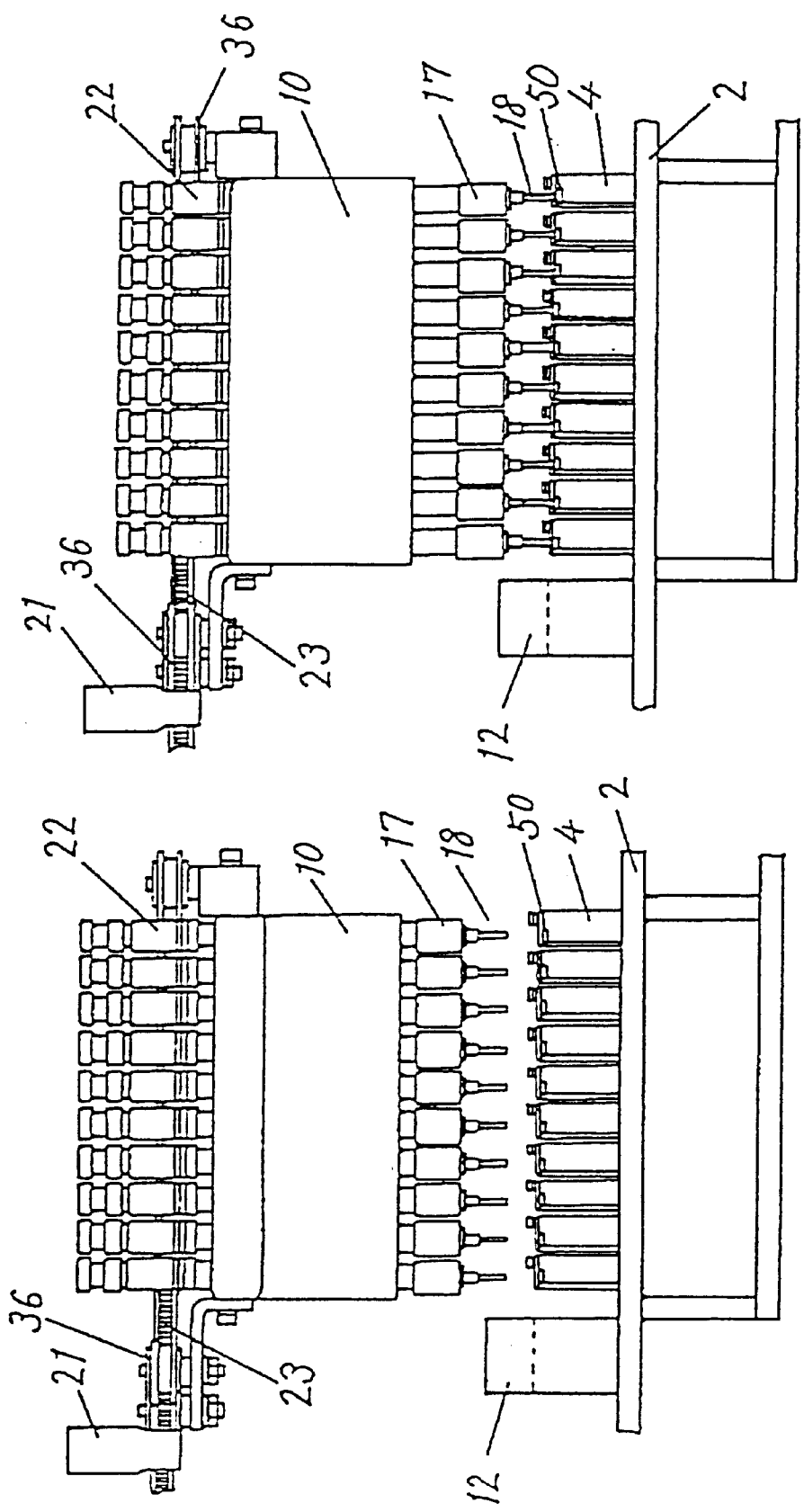
FIGS. 12(a), 12(b), and 13 are front views which show operations of mounting heads and pick-up nozzles when picking up electronic parts.
Figure 13:
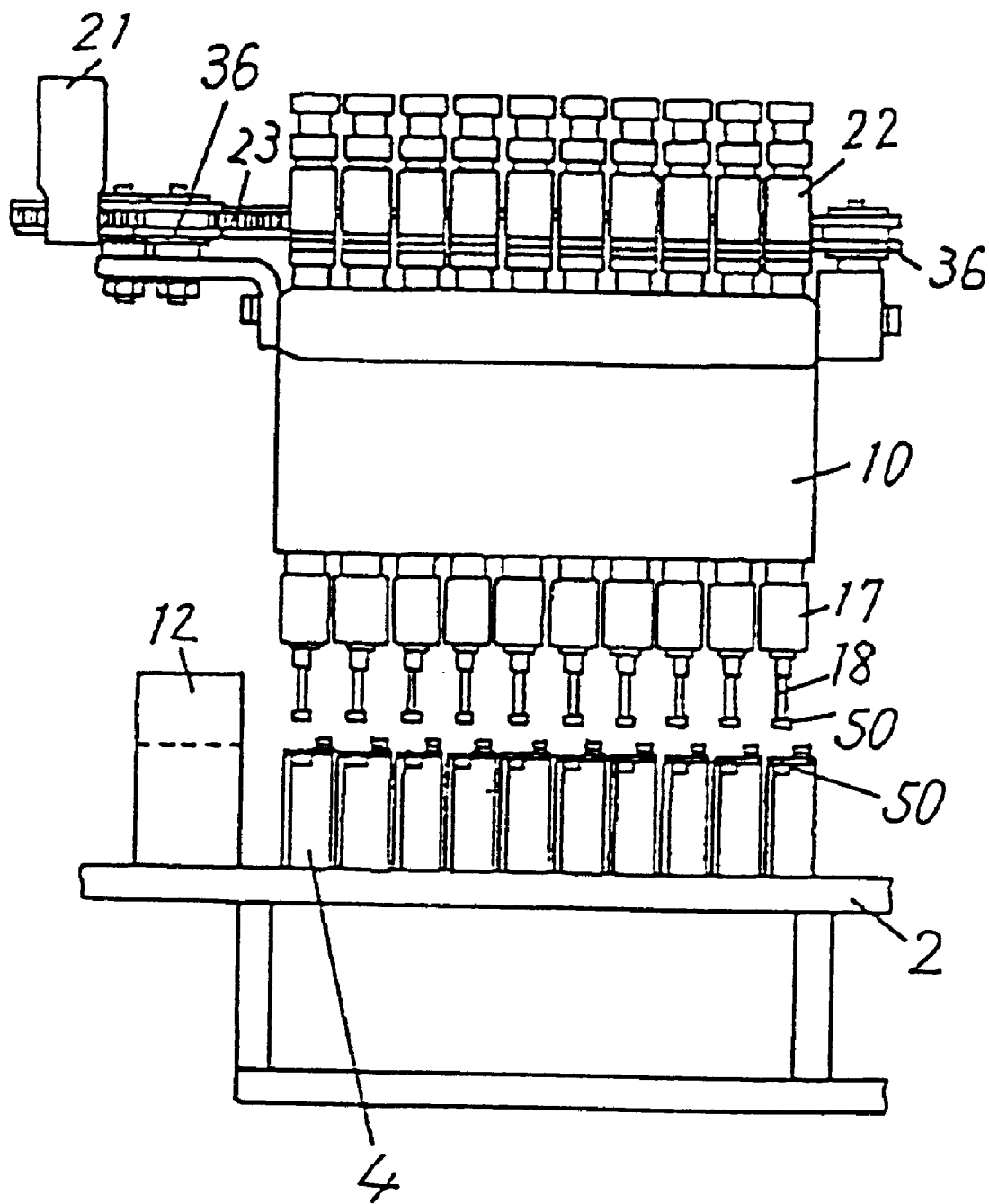

FIGS. 12(a), 12(b), and 13 show sequential operations of the first mounting head 10 when picking up the electronic parts 50. The operations of the second mounting head 11 are identical, and explanation thereof in detail will be omitted here.

First, the first mounting head 10 is, as shown in FIG. 12(a), moved to a given location on the first feeder 2 for picking up the electronic parts 50. The switches 90 of the ten pick-up nozzles 18 are then all turned off to release the holding of the pawl 32 by the electromagnets 33 so that the pawl 32 is moved downward. This causes the pick-up nozzles 18 to be moved downward, as shown in FIG. 12(b), with the aid of the spring force of the springs 26 so that each of the pick-up nozzles 18 faces a corresponding one of the ten electronic parts 50 positioned at the pick-up stations of the cassettes 4 and picks it up.

Next, the pawl 32 is, as shown in FIG. 13, moved upward, and at the same time, the pick-up nozzles 18 are all lifted up and stopped at the upper dead center. The first mounting head 10 then travels to the first line sensor 12 for monitoring whether the ten electronic parts 50 are all held by the pick-up nozzles 18 in a correct orientation or not. If the ten electronic parts are all held by the pick-up nozzles 18, then the first mounting head 10 moves toward the printed board 19 as discussed above.

During a time when the first mounting head 10 picks up the electronic parts 50 from the first parts feeder 2, the second mounting head 11 engages in mounting on the printed board 19 the electronic parts 50 picked up from the second feeder 3. Conversely, during a time when the second mounting head 11 picks up the electronic parts 50 from the second parts feeder 3, the first mounting head 10 engages in mounting on the printed board 19, the electronic parts 50 picked up from the first parts feeder 2. This achieves a high-speed mounting operation.

The second embodiment of the electronic parts mounting apparatus will be discussed below which is designed for mounting different types of electronic parts on a printed board in a one-time mounting operation using the pick-up nozzles 18 divided into a plurality of groups.

FIGS. 14(a) to 16 show sequential operations of the first mounting head 10 for picking up different types of electronic parts 50a and 50b which are different in thickness for example. The operations of the second mounting head 11 are identical, and explanation thereof in detail will be omitted here.

Figures 14A, 14B:
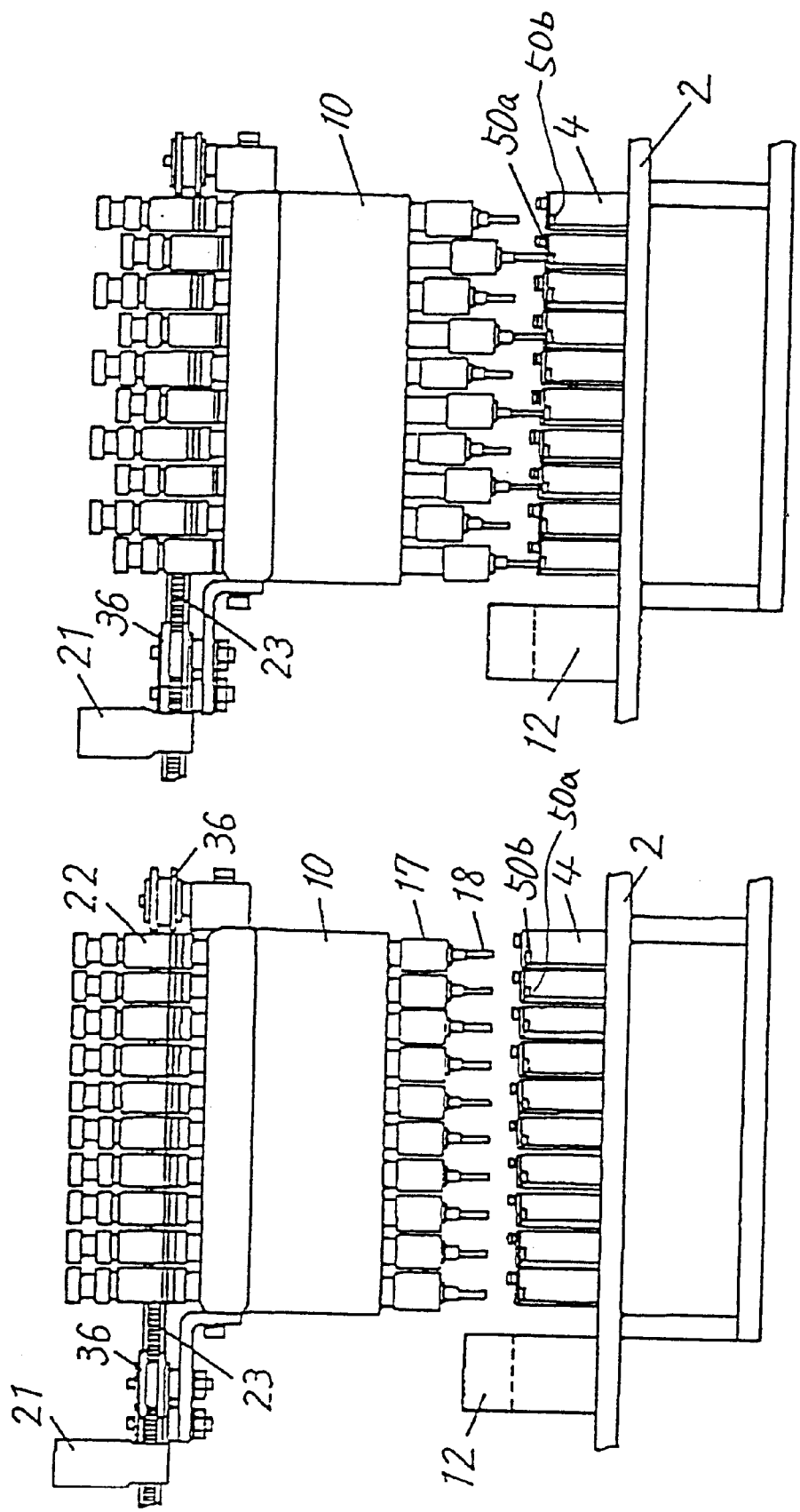

First, the first mounting head 10 is, as shown in FIG. 14(a), moved toward a given location on the first parts feeder 2 so that each of the pick-up nozzles 18 is aligned with a corresponding one of the electronic parts 50a and 50b. The switches 90 of a first group (five in this embodiment) of the pick-up nozzles 18, required to pick up the electronic parts 50a are turned off, thereby causing the first group of the pick-up nozzles 18 to be moved downward a first distance according to downward movement of the pawl 32, to pick up the electronic parts 50a from the cassettes 4.

Next, the pawl 32 is, as shown in FIG. 15(a), moved upward, lifting up the first group of the pick-up nozzles 18 holding the electronic parts 50a. Upon reaching the upper dead center, the pick-up nozzles 18 are stopped.

Figure 16:
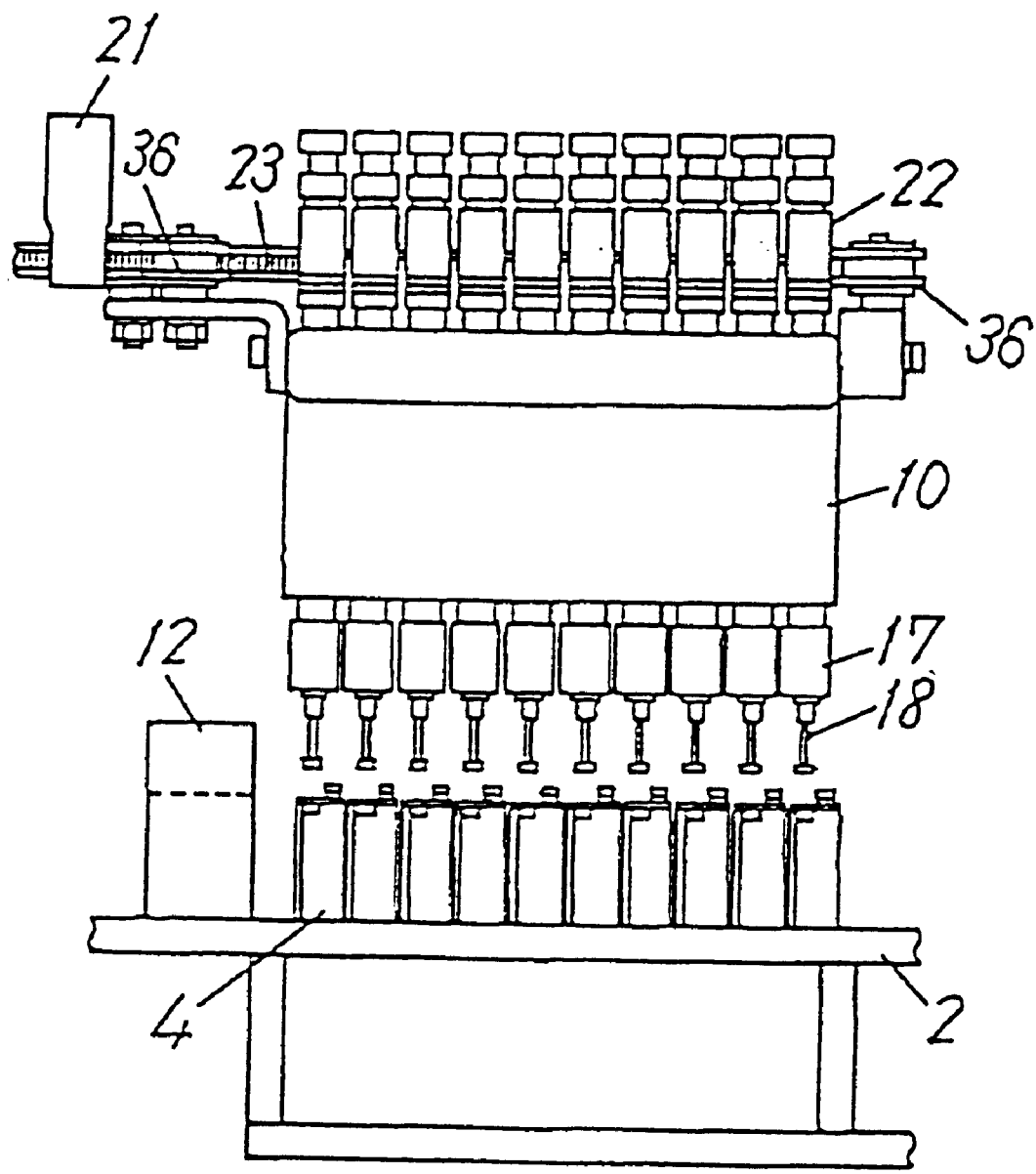

The switches 90 of the first group of the pick-up nozzles 18 are then turned on, while the switches 90 of a second group of the pick-up nozzles 18 (i.e., the remaining five of the pick-up nozzles 18 in this embodiment) are turned off, causing the second group of the pick-up nozzles 18 to be, as shown in FIG. 15(b), moved downward a second distance shorter than the first distance to pick up the electronic parts 50b which are greater in thickness than the electronic parts 50a, after which they are lifted up and stopped at the upper dead center as shown in FIG. 16.

After the above sequential operations are completed, the first mounting head 10 travels to the line sensor 12 for monitoring whether all the pick-up nozzles 18 hold the electronic parts 50a and 50b or not. The following operations are the same as those discussed in the first embodiment, and explanation thereof in detail will be omitted here.

As apparent from the above discussion, the electronic parts mounting apparatus of the second embodiment is useful when it is required to control strokes of the pick-up nozzles 18 independently in the case where various types of electronic parts different in thickness, for example, need to be picked up and mounted on the printed board 19.

The third embodiment of the electronic parts mounting apparatus will be discussed below which is designed for picking up the electronic parts 50 from some of the cassettes 4 using selected pick-up nozzles 18.

FIGS. 17(a) to 19(b) show sequential pick-up operations of the first mounting head 10. The operations of the second mounting head 11 are identical, and explanation thereof in detail will be omitted here.

First, the first mounting head 10 is, as shown in FIG. 17(a), moved toward a given location on the first feeder 2 so that each of the pick-up nozzles 18 is aligned with a corresponding one of the electronic parts 50. The switches 90 of selected pick-up nozzles 18 (two of the pick-up nozzles 18 in this embodiment) required to pick up the electronic parts 50 are turned off, thereby causing the selected pick-up nozzles 18 to be moved downward, as shown in FIG. 17(b), with the aid of the spring force of the springs 26 according to the downward movement of the pawl 32 so that selected electronic parts 50 are lifted up from the cassettes 4.

Figures 18A, 18B:
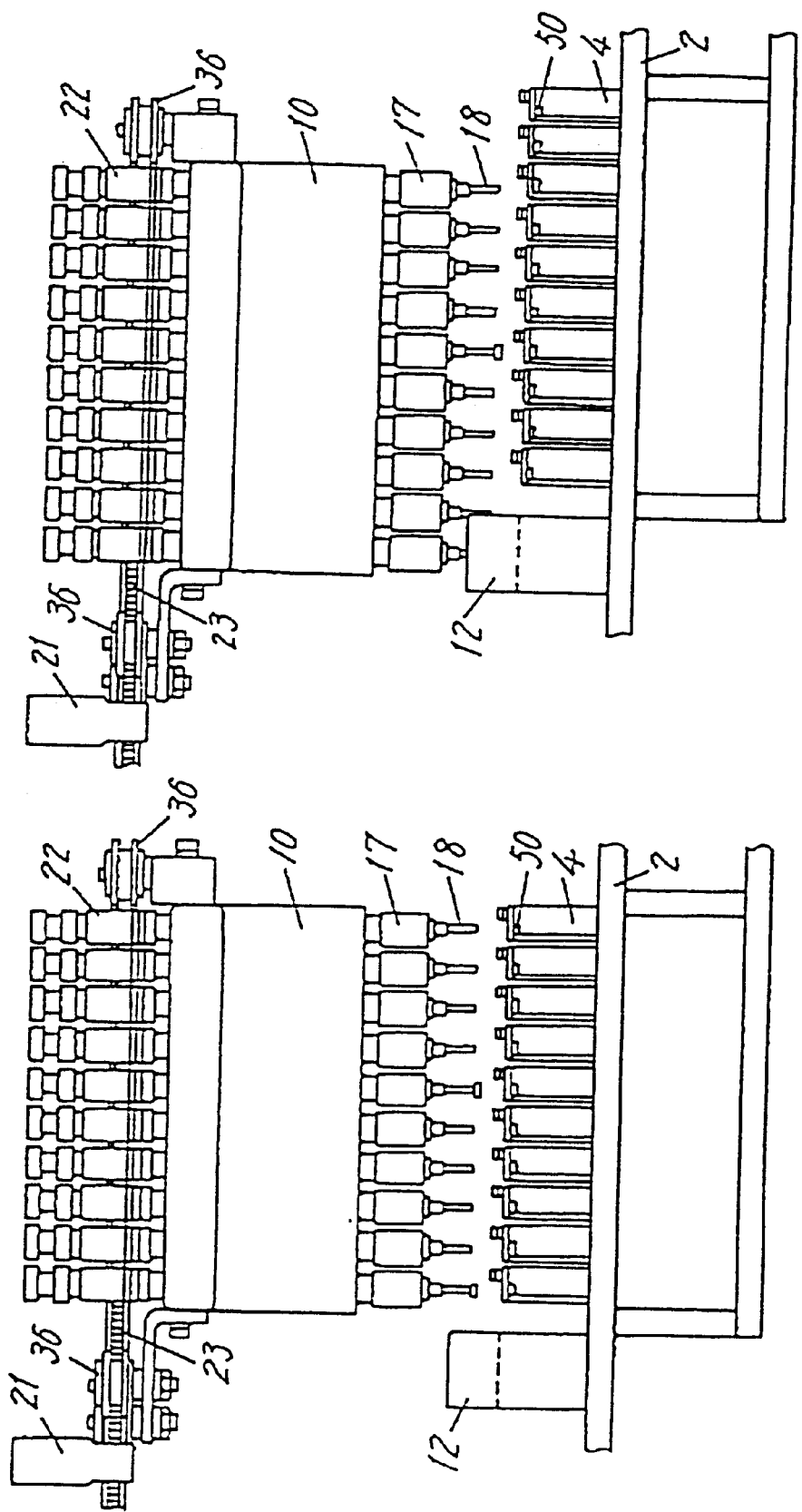

Next, the pawl 32 is moved upward, lifting up the pick-up nozzles 18, holding the electronic parts 50 as shown in FIG. 18(a). Upon reaching the upper dead center, the pick-up nozzles 18 are stopped.

Figures 19A, 19B:
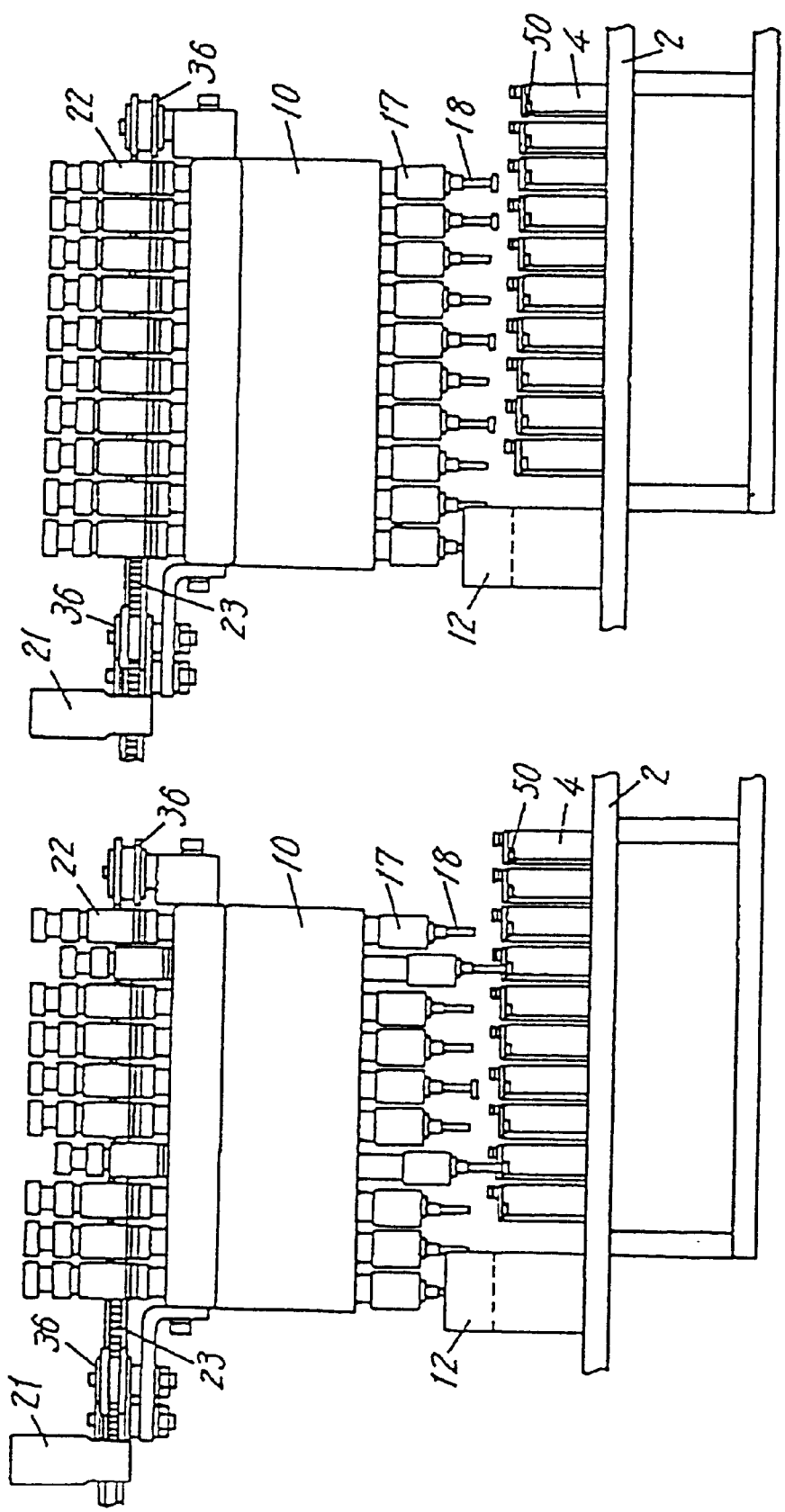

Subsequently, the first mounting head 10 is shifted to the left as viewed in FIG. 18(b) to place second selected pick-up nozzles 18 which are different from those having already been picked up the electronic parts 50 in the above first pick-up operation, above the electronic parts 50 required to be picked up next, respectively. The switches 90 of the first selected pick-up nozzles 18 holding the electronic parts 50 are turned on, while the switches 90 of the second selected pick-up nozzles 18 are turned off to move the second selected pick-up nozzles 18 downward, as shown in FIG. 19(a), to pick up the desired electronic parts 50, after which they are lifted up and stopped at the upper dead center as shown in FIG. 19(b).

After the above sequential operations are completed, the first mounting head 10 travels to the line sensor 12 for monitoring whether the selected some of the pick-up nozzles 18 all hold the electronic parts 50 correctly or not. The following operations are the same as those discussed in the first embodiment, and explanation thereof in detail will be omitted here.

The electronic parts mounting apparatus of the fourth embodiment will be discussed below with reference to FIGS. 20(a) and 20(b).

Figure 20B:
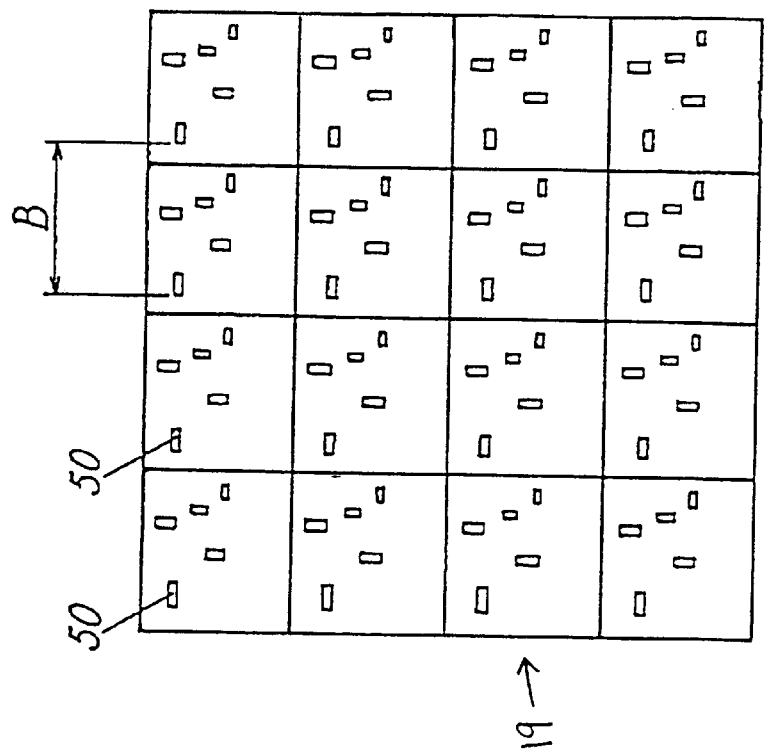
FIG. 20(b) is a plan view which shows another circuit pattern of a printed board used in the fourth embodiment of the invention.
Figure 20A:
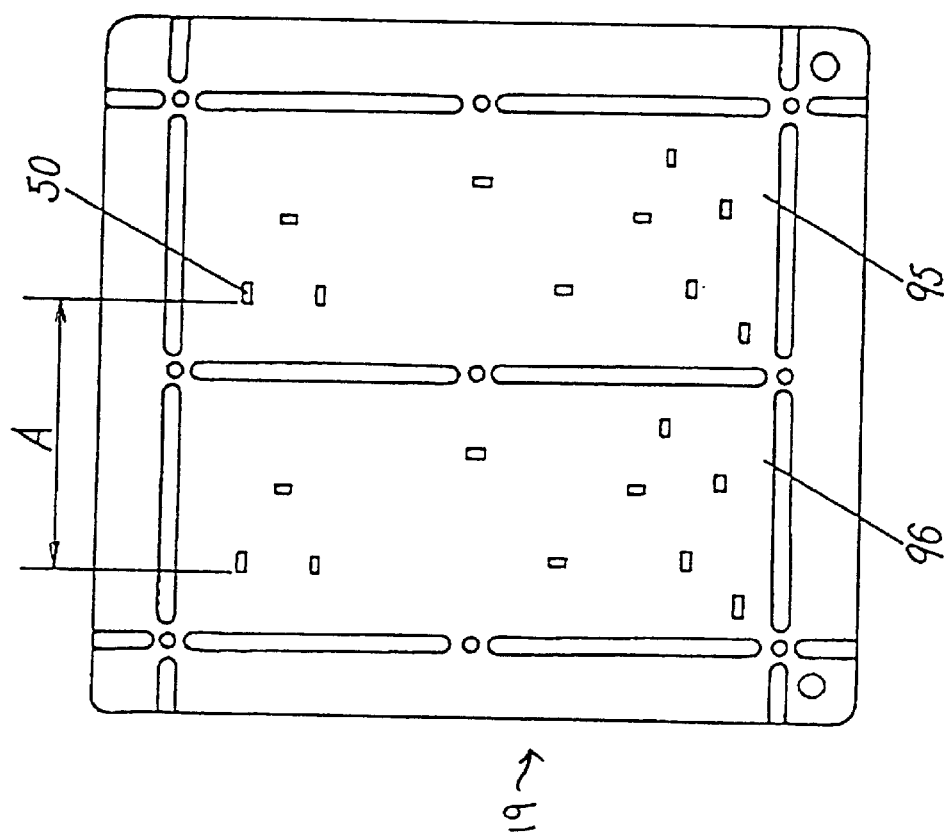
FIG. 20(a) is a plan view which shows a circuit pattern of a printed board used in the fourth embodiment of the invention.

FIG. 20(a) shows the printed board 19 having two of the same circuit patterns: first and second printed circuits 95 and 96. An interval A at which the same type of electronic parts 50 are mounted on the first and second printed circuits 95 and 96 is set to an integral multiple of the pitch of the pick-up nozzles 18 arranged adjacent to one another.

FIG. 20(a) shows another modified form of the printed board 19 formed with a 4×4 matrix consisting of 16 of the same printed circuits. An interval B at which the same type of electronic parts 50 are mounted on adjacent two of the printed circuits is set to an integral multiple of the pitch of the pick-up nozzles 18 arranged adjacent to one another.

The fourth embodiment, as discussed below, uses the above two types of the printed board 19.

Figure 21:
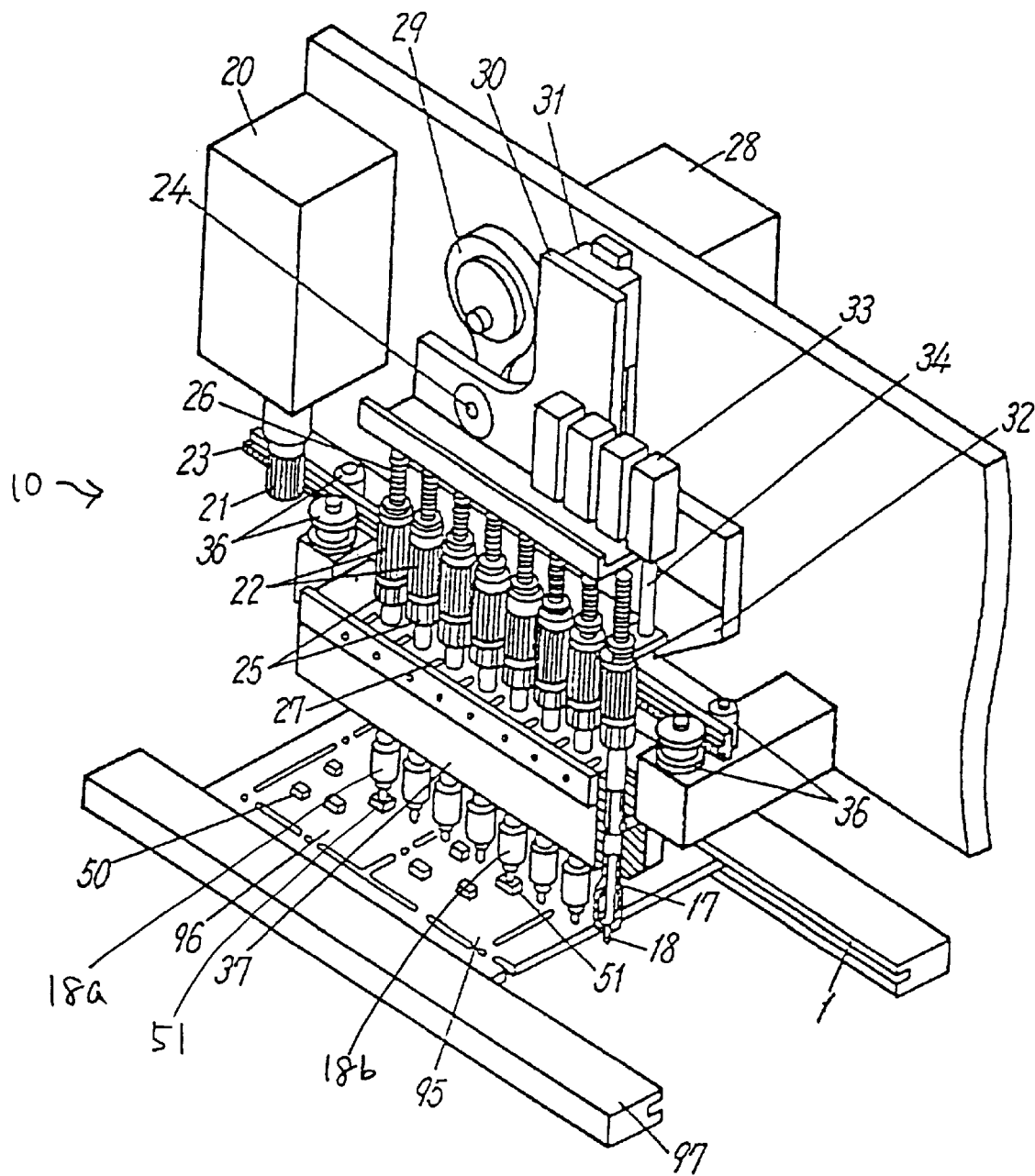
FIGS. 21 and 22 are partially perspective views which show sequential operations of a mounting head according to the fourth embodiment.

FIG. 21 shows the first mounting head 10 placed above the printed board 19 positioned by the guide rail 97. The operation of the second mounting head 11 is identical with that of the first mounting head 10, and explanation thereof in detail will be omitted here.

Figure 22:
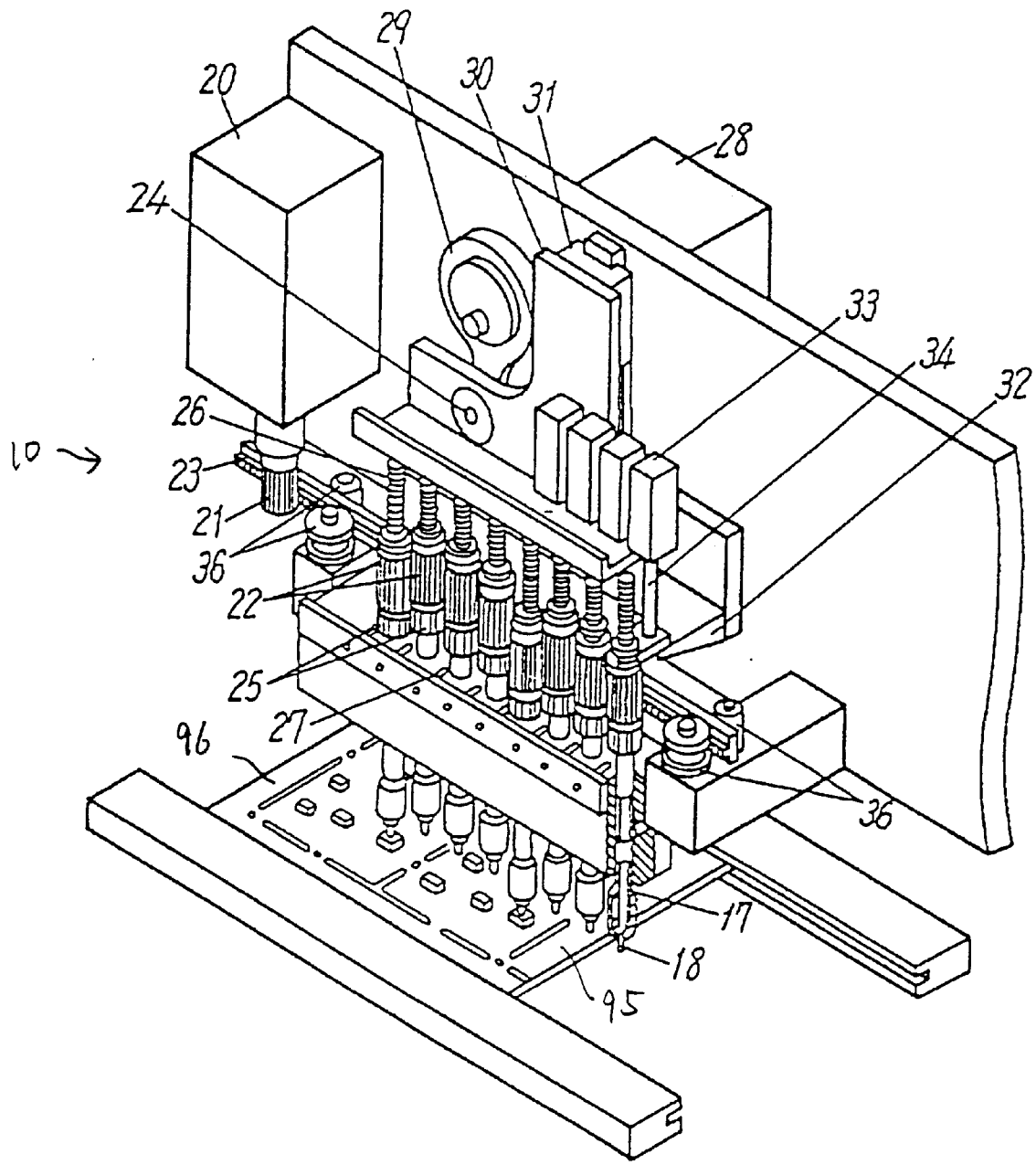

When the same type of electronic parts 50 are mounted on the first and second printed circuits 95 and 96 of the printed board 19 shown in FIG. 20(a), respectively, the pick-up nozzles, as indicated by numerals 18a and 18b in FIG. 21, arranged at the interval A away from each other, pick up the electronic parts 50 and mount them, as shown in FIG. 22, on the first and second printed circuits 95 and 96 simultaneously.

When the same type of electronic parts 50 are mounted on the printed board 19 shown in FIG. 20(b), the pick-up nozzles 18 arranged at the interval B away from each other pick up the electronic parts 50 and mount them on two adjacent printed circuits of the printed board 19 simultaneously.

Therefore, the fourth embodiment decreases the number of operations of moving the first and second mounting heads 10 and 11 to achieve a higher-speed mounting operation as compared with a conventional system which transports, one by one, the same type of electronic parts to a printed board.

Figure 23:
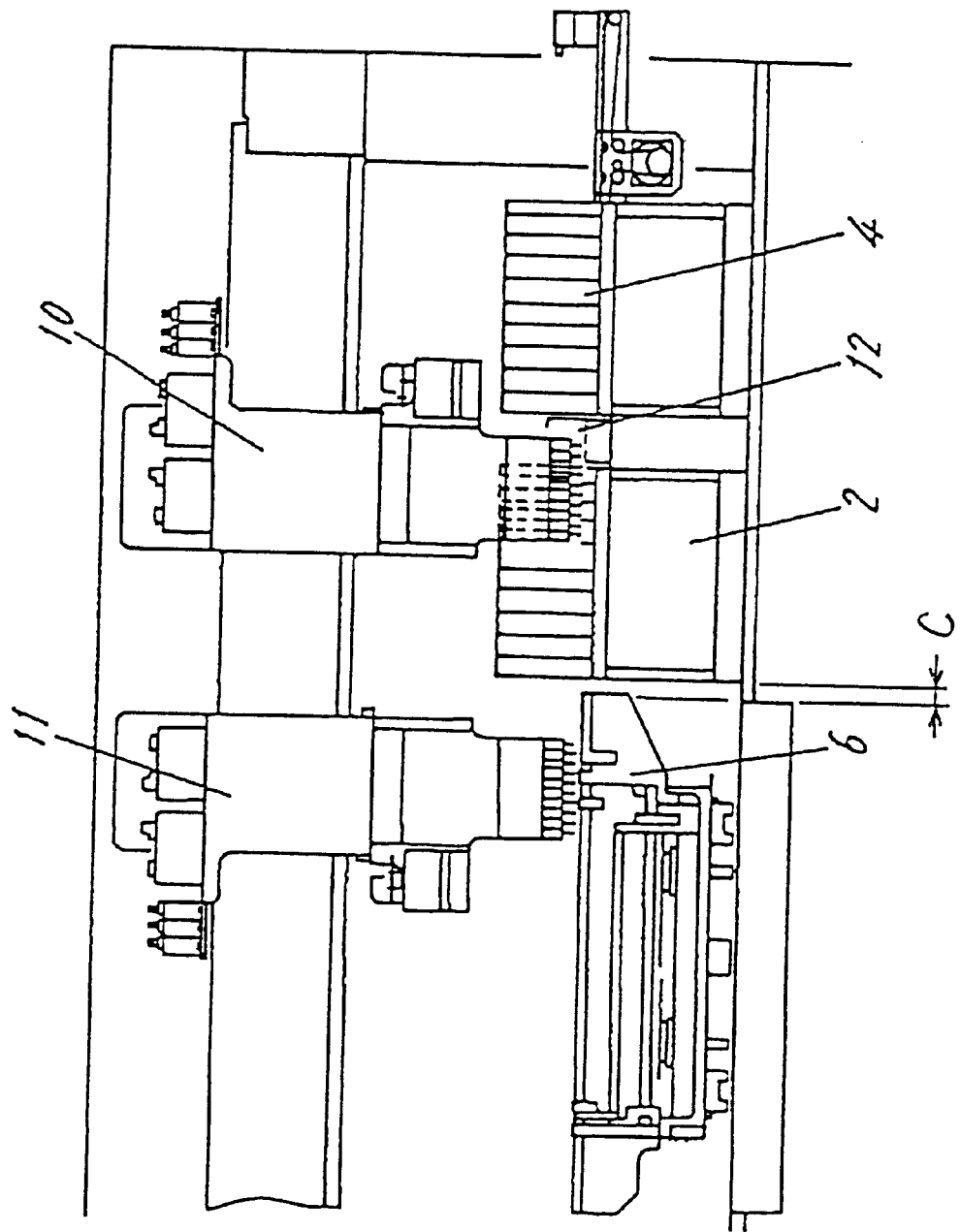
FIGS. 23 and 24 are illustrations for explaining the advantages of arrangement a line sensor of in an electronic parts mounting apparatus of the invention.

The benefits offered by the arrangement of the line sensors 12 and 13, as shown in FIG. 2, will be described below with reference to FIGS. 23 and 24.

Figure 24:
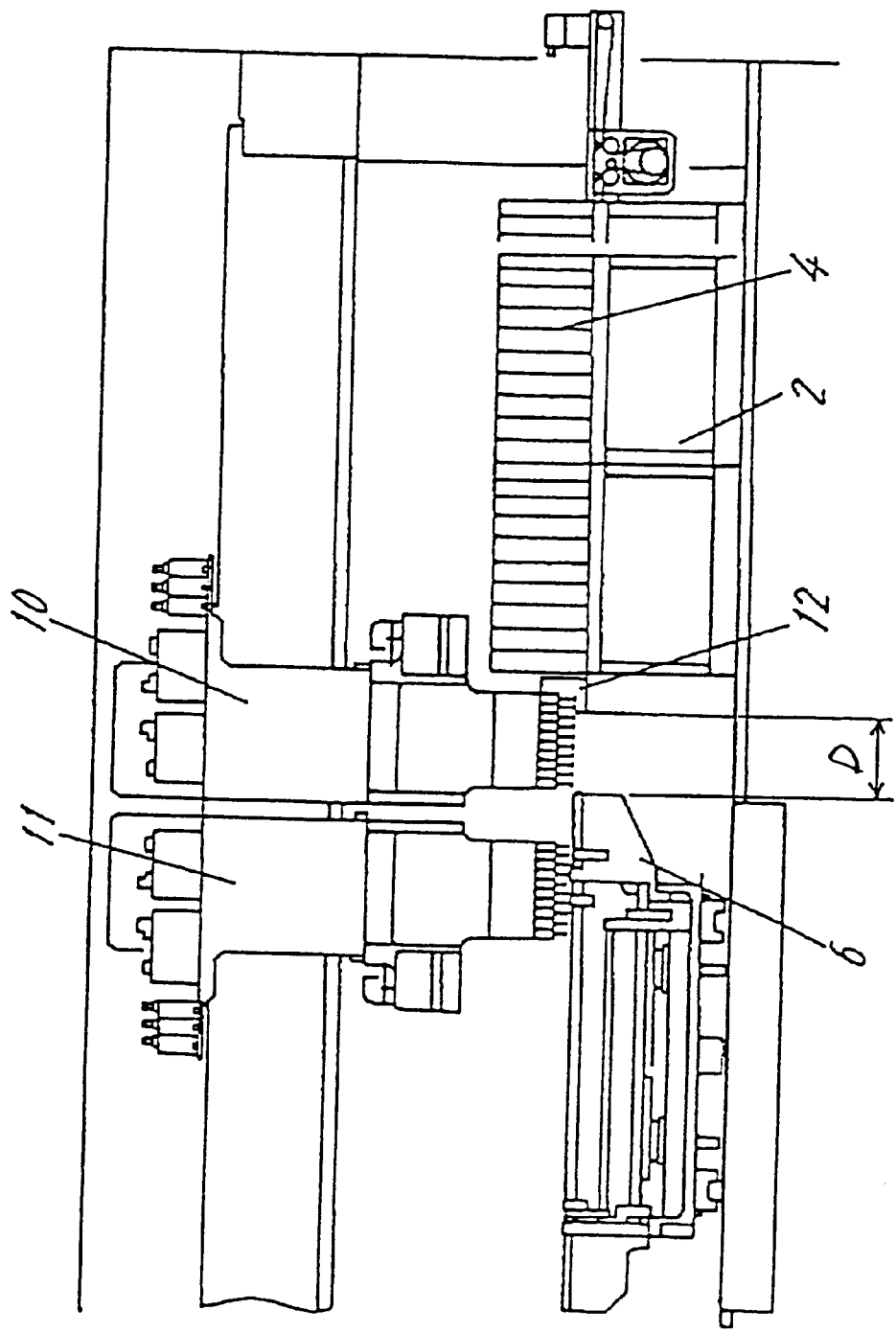

If the line sensor 12 is, as shown in FIG. 24, disposed between the table 6 and the first parts feeder 2, an interval D between the table 6 and the first line sensor 12 needs to be increased in order to avoid interference of the first mounting head 10 with the second mounting head 11, when the first mounting head 10 is at rest until completion of the parts-mounting operation of the second mounting head 11, after the first mounting head 10 takes up the electronic parts 50 from the cassettes 4, and the electronic parts 50 are detected by the first line sensor 12. However, the arrangement of the first line sensor 12, as shown in FIG. 23, in a gap formed in the central portion of the first parts feeder 2, that is, between the two sets of the cassettes 4 of the first parts feeder 2, allows the interval between the table 6 and the first parts feeder 2 to be shortened, as indicated by C, thereby resulting in a decrease in size of the entire structure of the apparatus.

Further, if a failure of the first mounting head 10 in picking up the electronic parts 50 is detected by the first line sensor 12, the above arrangement of the first line sensor 12 decreases a displacement of the first mounting head 10 required for resuming the operation of the apparatus, thereby resulting in decreased time for the resumption.

Figure 25A:
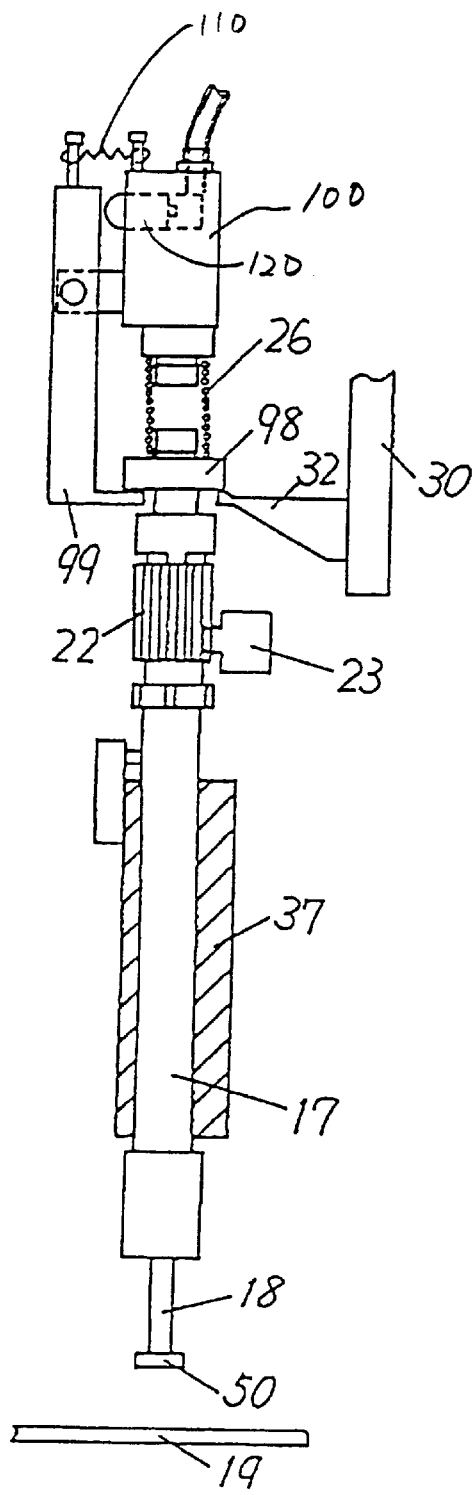
FIGS. 25(a) and 25(b) are side views which show a pick-up nozzle-dropping mechanism according to the fifth embodiment of the invention.
Figure 25B:
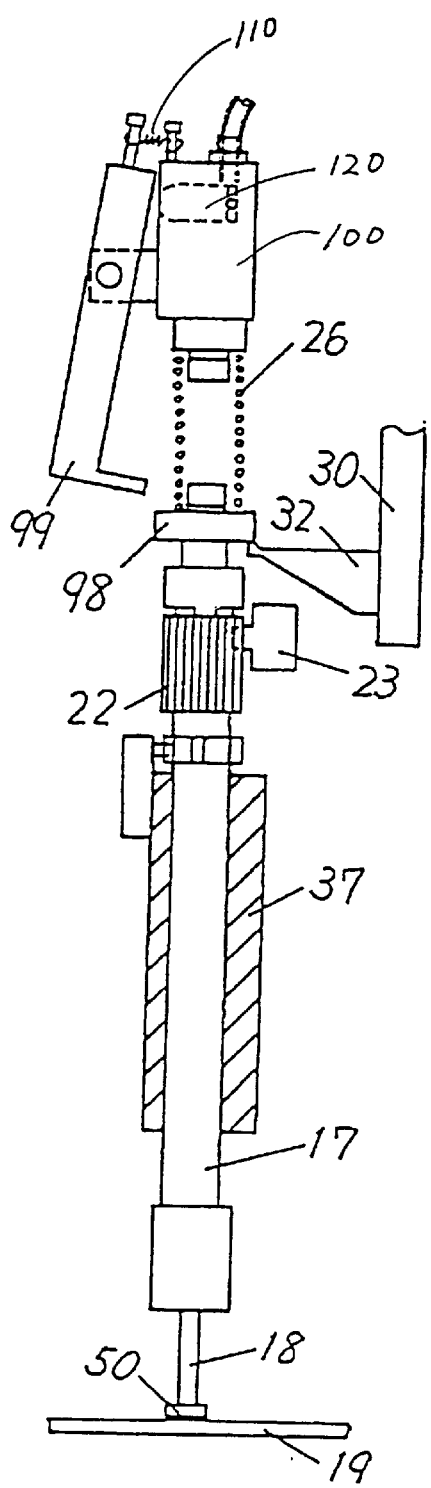

The electronic parts mounting apparatus of the fifth embodiment will be discussed below with reference to FIGS. 25(a) and 25(b) which is different from the above first embodiment in that a pick-up nozzle-dropping mechanism 100 is provided for each of the pick-up nozzles 18 instead of the electromagnets 33 and the cylinders 34. Other arrangements are the same as those of the first embodiment, and explanation thereof in detail will be omitted here.

The pick-up nozzle-dropping mechanism 100 includes an L-shaped lock lever 99, a spring 110, and an air-activated piston 120. The lock lever 99 is pivotably supported and urged by the spring 110 clockwise, as viewed in the drawings. When the piston 120 projects, as shown in FIG. 25(a), to the outside against a spring force of the spring 110, the lock lever 99 engages at its end with the flange 98 to hold the pick-up nozzle 18 at a given level. When the piston 1is, as shown in FIG. 25(b), withdrawn, it will cause the lock lever 99 to be turned clockwise with the aid of the spring force of the spring 110, thereby releasing the engagement with the flange 98. The pick-up nozzle 18 is then moved downward with the aid of the spring force of the spring 26 according to the downward movement of the pawl 32.

Figure 26:
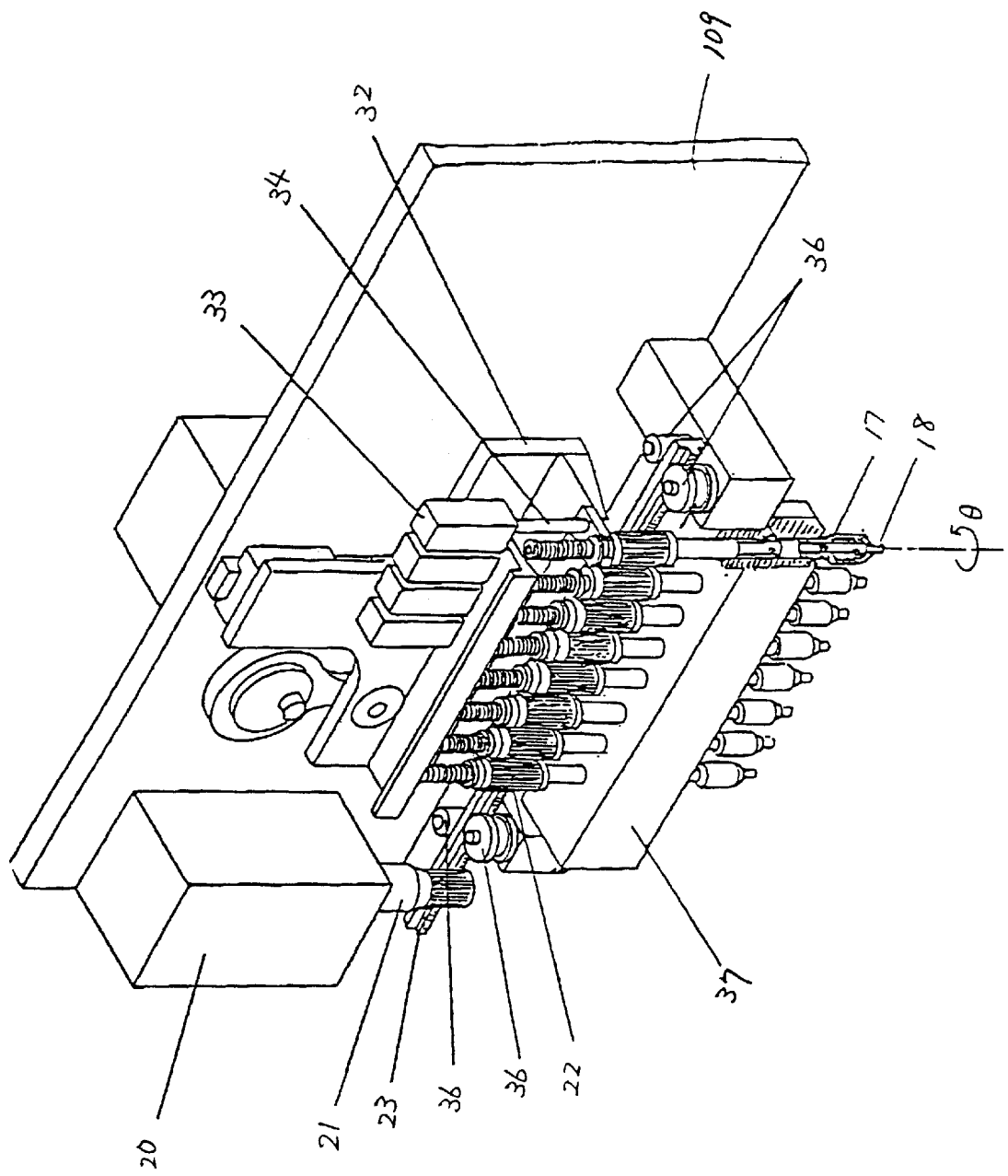
FIG. 26 is a partially perspective view which shows a mounting head according to the sixth embodiment of the invention.
Figure 27:
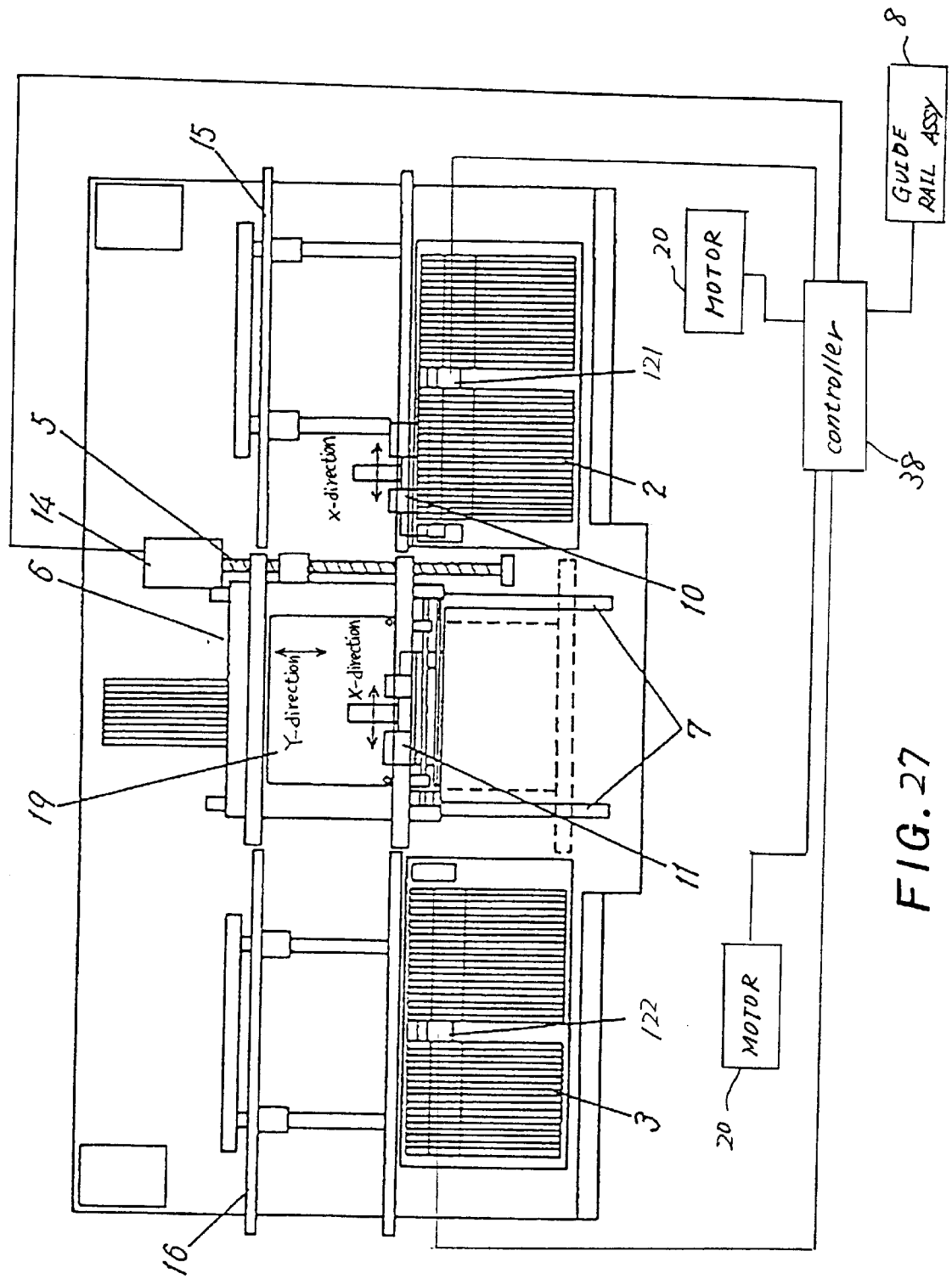
FIG. 27 is a plan view of an electronic parts mounting apparatus according to the sixth embodiment of the invention.
Figure 28:
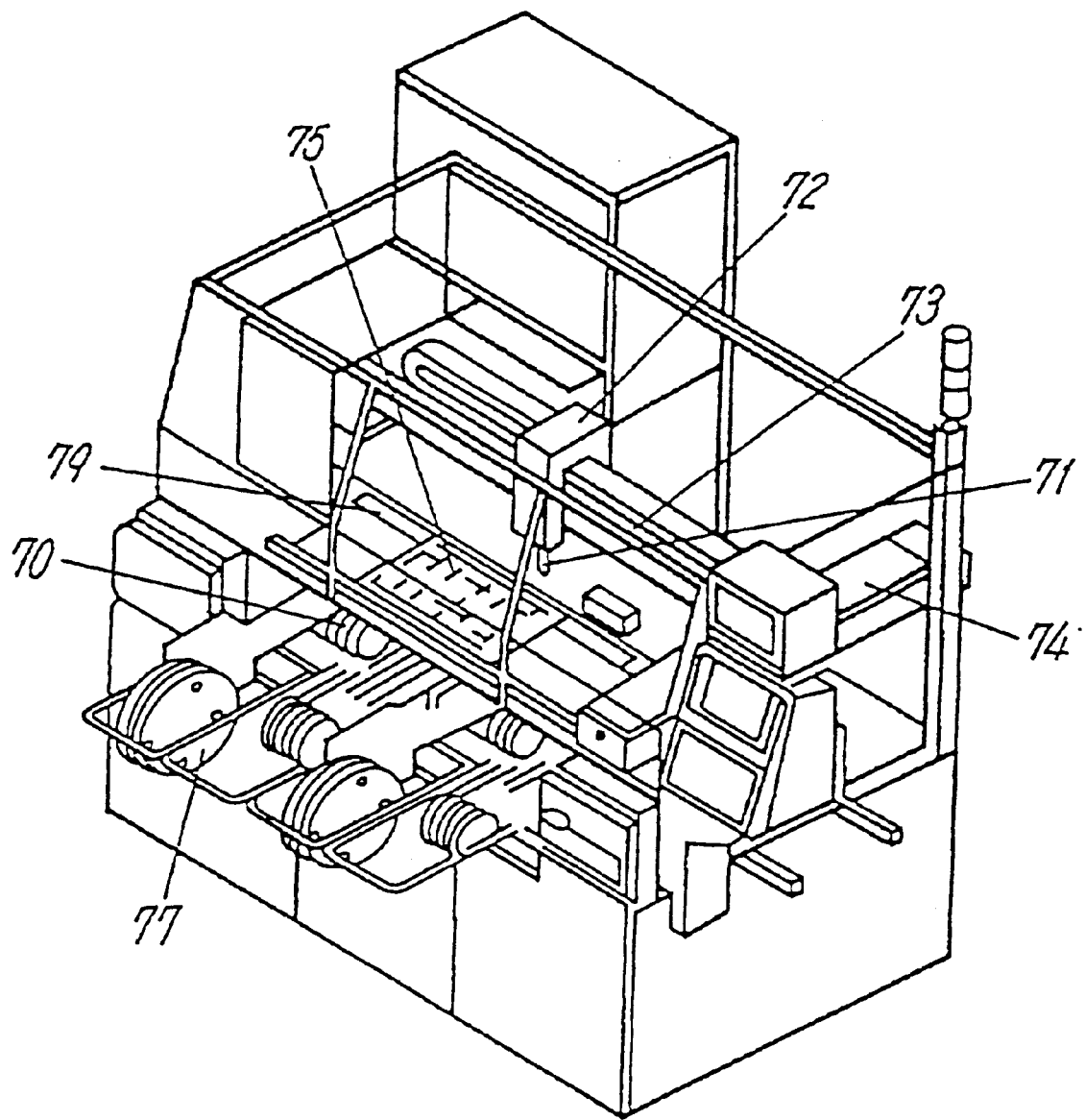
FIG. 28 is a perspective view which shows a conventional electronic parts mounting apparatus.
Figure 29:
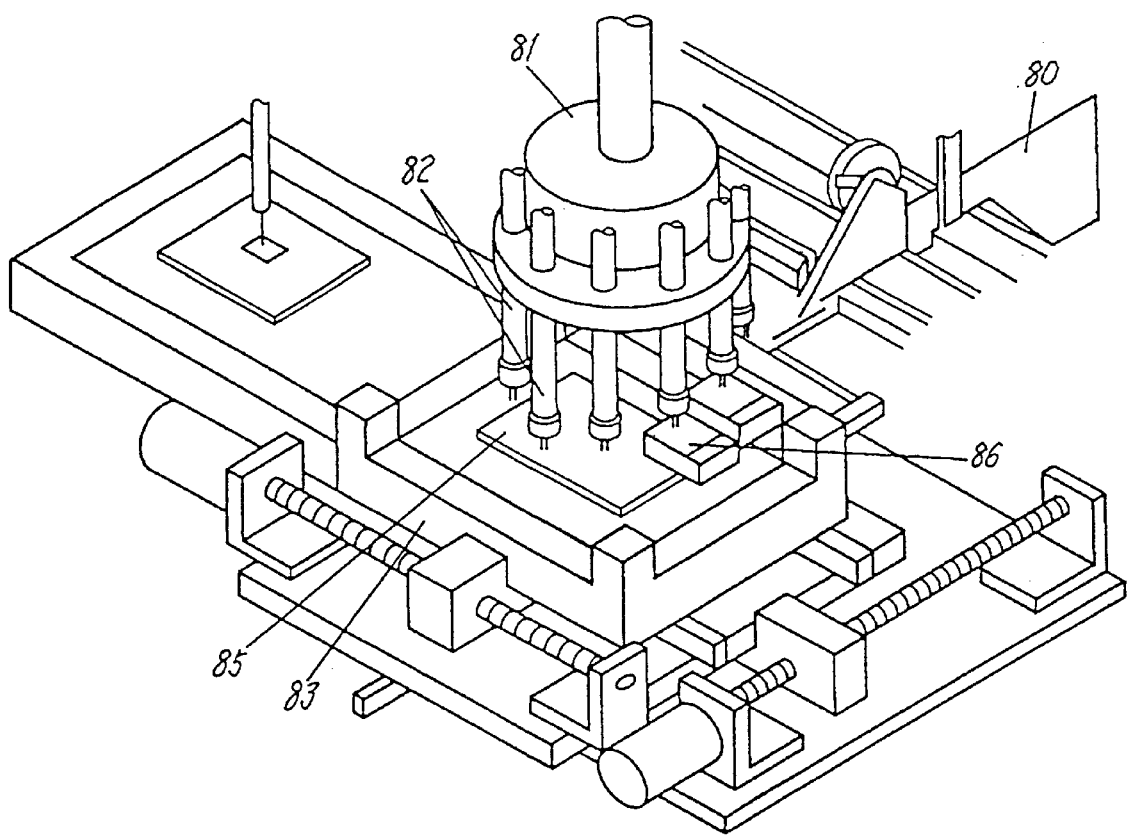
FIG. 29 is a perspective view which shows another conventional electronic parts mounting apparatus.

FIGS. 26 and 27 show the sixth embodiment of the electronic parts mounting apparatus which is designed to correct shifts of the electronic parts 50 caused when picked up by the pick-up nozzles 18 for mounting them in place on the printed board 19. The same reference numbers as employed in the above embodiments refer to the same parts, and explanation thereof in detail will be omitted here.

The electronic parts mounting apparatus of this embodiment, as clearly shown in FIG. 26, does not have the positioning holders 25 and the plate 94, as used in the above embodiments, on which the positioning pins 27 are secured and is designed so as to rotate the pick-up holders 18 in an angular direction θ through the motor 20, the rack 23, and the driven gears 22 mounted on the shaft 17 for correcting angular shifts of the electronic parts 50. The rack 23 may alternatively be placed with a belt.

The electronic parts mounting apparatus also includes parts position monitors 121 and 122, as shown in FIG. 27, instead of the line sensors 12 and 13 disposed within the central gaps of the first and second parts feeders 2 and 3. Each of the parts position monitors 121 and 122 includes, for example, a CCD image sensor which monitors the position of each of the electronic parts 50 during movement of each of the first and second parts feeders 2 and 3 in the X-direction and provides a signal indicative thereof to the controller 38. The controller 38 determines shifts of each of the electronic parts 50 in the X-, Y-, and 0-directions and provides, if they exceed allowable ranges, shift-correcting signals to the motor 14 for the table 6, the guide rail assembly 8, and the motors for the first and second mounting heads 10 and 11, respectively.

In shift-correcting operation, the shift in the Y-direction is corrected by moving the table 6 through the motor 14. The shift in the X-direction is corrected by moving the first or second mounting heads 10 and 11 along the guide rail assembly 8. The shift in the angular direction 0 is corrected by rotating the pick-up nozzles 18 about longitudinal center lines thereof through the motor 20.

In the mounting operation, if all the electronic parts 50 held by the pick-up nozzles 18 are shifted in position, they are subjected to the shift-correcting operation and then mounted on the printed board 19 in sequence. If only some of the electronic parts 50 held by the pick-up nozzles 18 are shifted in position, they are subjected to the shift-correcting operation and mounted on the printed board 19 in sequence, after which the other electronic parts 50 are mounted simultaneously or sequentially.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims. For example, the sliding mechanism for the table 6 including the electric motor 14 and the ball screw 5 may be replaced with a sliding mechanism consisting of a linear servomotor, a rack and pinion, and a wire. The nozzle-turning mechanism for each of the first and second mounting heads 10 and 11 includes the rotation drive motor 20, the pinion 21, and the rack 23, but a pulley and a belt may be used instead. Further, the vertical movement of each of the first and second mounting heads 10 and 11 may be achieved by using a cylinder actuator, a linear servomotor, and a ball screw instead of the vertical slide drive motor 20, the slider 31, and the crank 29.

What is claimed is:

1. An electronic parts mounting apparatus comprising:

a first parts feeder including a plurality of cassettes each of which stores therein electronic parts and has a pick-up station;

a second parts feeder including a plurality of cassettes each of which stores therein electronic parts and has a pick-up station, said second parts feeder being positioned at a preselected interval away from said first parts feeder in a first direction;

a table for holding thereon a printed board on which the electronic parts are to be mounted, said table being disposed within the preselected interval between said first and second parts feeders and designed to move in a second direction perpendicular to said first direction linearly;

a first mounting head including a plurality of pick-up nozzles movable in a vertical direction for simultaneously picking up the electronic parts from the pick-up stations, said first mounting head being disposed so as to move in said first direction linearly, all of the pick-up nozzles of said first mounting head being arranged adjacent to one another in a single linear array;

a second mounting head including a plurality of pick-up nozzles movable in the vertical direction for simultaneously picking up the electronic parts from the pick-up stations, said second mounting head being disposed so as to move in said first direction linearly, all of the pick-up nozzles of said second mounting head being arranged adjacent to one another in a single linear array;

a first and a second sensor monitoring the presence and orientation of the electronic parts picked up by the pick-up nozzles of said first and second mounting heads and providing signals indicative thereof during linear movement of said first and second mounting heads in said first direction;

a controller for controlling linear movement of said table in the second direction and the linear movement of said first and second mounting heads in the first direction so that said first and second mounting heads pick up the electronic parts from the pick-up stations and then mount the electronic parts on given places of the printed board held on said table.

2. An electronic parts mounting apparatus as set forth in claim 1, wherein the cassettes of each of said first and second parts feeders are disposed adjacent to each other at first pitches in the first direction, the pick-up nozzles of each of the first and second mounting heads being disposed adjacent to each other at second pitches equal to said first pitches.

3. An electronic parts mounting apparatus as set forth in claim 1, wherein said controller controls the movement of said first and second mounting heads in first and second operation modes, the first operation mode being such that said first mounting head picks up the electronic parts from the pick-up stations of said first parts feeder through the pick-up nozzles, while the second mounting head mounts the electronic parts which have already been picked up by the pick-up nozzles thereof on the printed board held on said table, the second operation mode being such that said second mounting head picks up the electronic parts from the pick-up stations of said second parts feeder through the pick-up nozzles, while the first mounting head mounts the electronic parts which have already been picked up by the pick-up nozzles thereof on the printed board held on said table.

4. An electronic parts mounting apparatus as set forth in claim 1, wherein said controller controls vertical movement of the pick-up nozzles of each of said first and second mounting heads so that the pick-up nozzles of each of said first and second mounting heads pick up the electronic parts simultaneously.

5. An electronic parts mounting apparatus as set forth in claim 1, wherein said controller controls said first and second mounting heads so that a first group consisting of a first number of the pick-up nozzles and a second group consisting of a second number of the pick-up nozzles of each of said first and second mounting heads are moved with different timings for picking up the electronic parts.

6. An electronic parts mounting apparatus as set forth in claim 5, wherein each of the pick-up nozzles of the first group of each of said first and second mounting heads picks up one of the electronic parts from selected one of the pick-up stations of the cassettes in a first pick-up operation, while each of the pick-up nozzles of the second group of each of said first and second mounting heads picks up one of the electronic parts from selected one of the pick-up stations of the cassettes in a second pick-up operation following said first pick-up operation.

7. An electronic parts mounting apparatus as set forth in claim 1, wherein said controller controls vertical movement of the pick-up nozzles of each of said first and second mounting heads so that at least one of the pick-up nozzles of each of said first and second mounting heads is moved to pick up one of the electronic parts from selected one of the pick-up stations of the cassettes.

8. An electronic parts mounting apparatus as set forth in claim 1, wherein said controller controls movement of each of said first and second mounting heads in the first direction and vertical movement of the pick-up nozzles of each of said first and second mounting heads so that each of a given number of the pick-up nozzles of each of said first and second mounting heads picks up one of the electronic parts from selected one of the pick-up stations of the cassettes.

9. An electronic parts mounting apparatus as set forth in claim 1, wherein each of said first and second mounting heads includes a nozzle-moving mechanism having an elevation member for elevating the pick-up nozzles upward simultaneously and dropping means for dropping the pick-up nozzles independently of each other.

10. An electronic parts mounting apparatus as set forth in claim 1, further comprising a first and a second sensor disposed in said first and second parts feeders, respectively, for monitoring the presence and orientation of the electronic parts picked up by the pick-up nozzles and providing signals indicative thereof.

11. An electronic parts mounting apparatus as set forth in claim 1, further comprising turning means for turning each of the pick-up nozzles about the center thereof.

12. An electronic parts mounting apparatus as set forth in claim 11, wherein each of the pick-up nozzles has a length extending in the vertical direction, and wherein said turning means turns each of the pick-up nozzles about a center line thereof extending in a lengthwise direction of each of the pick-up nozzles.

13. An electronic parts mounting apparatus as set forth in claim 1, further comprising a position monitor and a positional shift correcting mechanism, said position monitor monitoring a position of each of the electronic parts held by the pick-up nozzles to determine a positional shift from a given correct position, said positional shift correcting mechanism adjusting a relative position between the table and one of the electronic parts having the positional shift so as to compensate for the positional shift.

14. An electronic parts mounting apparatus as set forth in claim 13, wherein said positional shift correcting mechanism includes a turning mechanism designed to turn each of the pick-up nozzles about the center thereof.

15. An electronic parts mounting apparatus as set forth in claim 14, wherein said positional shift correcting mechanism also includes a moving mechanism designed to move said table in the second direction.

16. An electronic parts mounting apparatus as set forth in claim 15, wherein said positional shift correcting mechanism further includes a second moving mechanism designed to move said first and second mounting heads in the first direction.

17. An electronic parts mounting apparatus as set forth in claim 1, wherein the cassettes of each of said first and second parts feeders are disposed adjacent to one another, and wherein the cassettes of said first parts feeder are arranged in alignment with the cassettes of said second parts feeder in said first direction.

18. An electronic parts mounting apparatus as set forth in claim 1, wherein each of the cassettes of each of said first and second parts feeders includes a positioning mechanism which positions each of the electronic parts at the pick-up station.

* * * * *